United States Patent
Masuda et al.

(10) Patent No.: US 10,651,229 B2
(45) Date of Patent: May 12, 2020

(54) SOLID-STATE IMAGE DEVICE AND METHOD FOR MANUFACTURING SOLID-STATE IMAGE DEVICE, AND ELECTRONIC DEVICE

(71) Applicant: SONY CORPORATION, Tokyo (JP)

(72) Inventors: Yoshiaki Masuda, Kumamoto (JP); Kyohei Mizuta, Kumamoto (JP); Keishi Inoue, Kumamoto (JP); Akira Shinozaki, Tokyo (JP)

(73) Assignee: SONY CORPORATION, Tokyo (JP)

( * ) Notice: Subject to any disclaimer, the term of this patent is extended or adjusted under 35 U.S.C. 154(b) by 841 days.

(21) Appl. No.: 15/121,961

(22) PCT Filed: Feb. 24, 2015

(86) PCT No.: PCT/JP2015/055141
§ 371 (c)(1),
(2) Date: Aug. 26, 2016

(87) PCT Pub. No.: WO2015/133324
PCT Pub. Date: Sep. 11, 2015

(65) Prior Publication Data
US 2017/0077169 A1   Mar. 16, 2017

(30) Foreign Application Priority Data
Mar. 6, 2014 (JP) ................. 2014-044037

(51) Int. Cl.
*H01L 27/146* (2006.01)
*G02B 5/20* (2006.01)
(Continued)

(52) U.S. Cl.
CPC .......... *H01L 27/14685* (2013.01); *G02B 5/20* (2013.01); *H01L 27/1464* (2013.01);
(Continued)

(58) Field of Classification Search
CPC ......... H01L 27/14685; H01L 27/14643; H01L 27/1464; H01L 27/14636; H01L 27/14634;
(Continued)

(56) References Cited

U.S. PATENT DOCUMENTS 8,455,870 B2 * 6/2013 Kim .................... G02F 1/13624
257/40
2010/0288911 A1 * 11/2010 Mizuta ............ H01L 27/14632
250/208.1

FOREIGN PATENT DOCUMENTS

JP   63-37655 A   2/1988
JP   5-299625 A   11/1993
(Continued)

OTHER PUBLICATIONS

International Search Report prepared by the Japan Patent Office dated May 11, 2015, for International Application No. PCT/JP2015/055141.

*Primary Examiner* — Yogesh K Aggarwal
(74) *Attorney, Agent, or Firm* — Sheridan Ross P.C.

(57) ABSTRACT

The present disclosure relates to a solid-state image device, a method for manufacturing the solid-state image device, and an electronic device that are capable of reducing uneven application of a color filter. A color filter and a plurality of connection unit areas are formed on a sensor board. At least one of the connection unit areas is placed a predetermined interval away from the other connection unit areas. The present disclosure can be applied, for example, to a backside illumination CMOS image sensor with a layer structure, a front-side illumination CMOS image sensor with a layer structure, or a CCD image sensor.

10 Claims, 26 Drawing Sheets

(51) Int. Cl.
*H04N 9/04* (2006.01)
*H04N 9/07* (2006.01)
*H01L 27/148* (2006.01)
*H04N 5/374* (2011.01)

(52) U.S. Cl.
CPC .. *H01L 27/14621* (2013.01); *H01L 27/14623* (2013.01); *H01L 27/14634* (2013.01); *H01L 27/14636* (2013.01); *H01L 27/14643* (2013.01); *H04N 9/045* (2013.01); H01L 27/14627 (2013.01); H01L 27/14806 (2013.01); H04N 5/374 (2013.01); H04N 9/07 (2013.01)

(58) Field of Classification Search
CPC ......... H01L 27/14623; H01L 27/14621; H01L 27/14806; H01L 27/14627; H04N 9/045; H04N 5/374; H04N 9/07; G02B 5/20
USPC .................................................. 348/294–324
See application file for complete search history.

(56) References Cited

FOREIGN PATENT DOCUMENTS

| | | | |
|---|---|---|---|
| JP | 2006-222514 | A | 8/2006 |
| JP | 2010-141020 | A | 6/2010 |
| JP | 2010-147230 | A | 7/2010 |
| JP | 2010-199602 | A | 9/2010 |
| JP | 2010-267675 | A | 11/2010 |
| JP | 2011-82391 | A | 4/2011 |
| JP | 2013-26565 | A | 2/2013 |
| WO | WO 2008/126268 | A1 | 10/2008 |
| WO | WO 2013/051462 | A1 | 4/2013 |

\* cited by examiner

SOLID-STATE IMAGE DEVICE AND METHOD FOR MANUFACTURING SOLID-STATE IMAGE DEVICE, AND ELECTRONIC DEVICE

CROSS REFERENCE TO RELATED APPLICATIONS

This application is a national stage application under 35 U.S.C. 371 and claims the benefit of PCT Application No. PCT/JP2015/055141 having an international filing date of 24 Feb. 2015, which designated the United States, which PCT application claimed the benefit of Japanese Patent Application No. 2014-044037 filed 06 Mar. 2014, the disclosures of which are incorporated herein by reference in their entirety.

TECHNICAL FIELD

The present disclosure relates to a solid-state image device and a method for manufacturing the solid-state image device, and an electronic device. In particular, the present disclosure relates to a solid-state image device and a method for manufacturing the solid-state image device, and an electronic device that are capable of reducing uneven application of a color filter.

BACKGROUND ART

Nowadays, there are backside illumination Complementary Metal-Oxide Semiconductor (CMOS) image sensors with a layer structure (for example, see Patent Document 1). The CMOS image sensor is manufactured in a manner in which a circuit board on which a drive circuit is formed is prepared separately from a sensor board on which an opto-electronic converter is formed, and the circuit board is stuck to a side opposite to the light-receptive surface of the sensor board.

Such a CMOS image sensor is formed into a layer structure in a manner in which the wiring layer surface of the sensor board is connected to the wiring layer surface of the circuit board. The CMOS image sensor is provided with a connection unit to electrically connect the sensor board and the circuit board. In the connection unit, a through-via penetrating the semiconductor layer of the sensor board and connected to the wiring layer of the sensor board is connected to a through-via penetrating the sensor board and connected to the wiring layer of the circuit board by a wiring unit formed on the upper part of the light-receptive surface of the semiconductor layer of the sensor board. A color filter and an on-chip lens for each pixel are provided on the light-receptive surface of the semiconductor layer of the sensor board.

In such a case, the shorter the distance between the color filter and the opto-electronic converter is, the better the sensitivity or the color mixture becomes. For example, in consideration of the limitations due to the circuit wiring or the alignment marks, or in order to loose the stress of the sensor board, it is preferable that the thickness (the length in a direction perpendicular to the sensor board) of the light-receptive surface of the semiconductor layer is thin. Thus, the peripheral area around the wiring unit is thinner than the wiring unit. The wiring unit forms a height difference on the light-receptive surface of the semiconductor layer. As a result, a color filter is unevenly applied on the light-receptive surface after the wiring is formed.

Similarly, when a wiring unit is formed around an area in which pixels are formed on the semiconductor substrate in a solid-state image device such as a front-side illumination CMOS image sensor or a Charge Coupled Device (CCD) image sensor and the wiring unit is thicker than the area, a height difference caused by the wiring unit causes uneven application of a color filter on the surface.

CITATION LIST

Patent Document

Patent Document 1: Japanese Patent Application Laid-Open No. 2013-214616

SUMMARY OF THE INVENTION

Problems to be Solved by the Invention

As described above, uneven application of the color filter due to the height difference of the wiring unit reduces the yield of the solid-state image devices.

In light of the foregoing, an objective of the present disclosure is to reduce uneven application of a color filter.

Solutions to Problems

A solid-state image device according to a first aspect of the present disclosure includes: a color filter formed on a first substrate; and a plurality of first height difference portions formed on the first substrate, wherein at least one of the first height difference portions is placed a first interval away from the other first height difference portions.

The first aspect of the present disclosure includes the color filter formed on a first substrate, and a plurality of first height difference portions formed on the first substrate. At least one of the first height difference portions is placed a first interval away from the other first height difference portions.

A method for manufacturing a solid-state image device according to a second aspect of the present disclosure includes a step of: manufacturing a solid-state image device, the solid-state image device including: a color filter formed on a first substrate; and a plurality of first height difference portions formed on the first substrate, wherein at least one of the first height difference portions is placed a first interval away from the other first height difference portions.

According to the second aspect of the present disclosure, a solid-state image device is formed so that the solid-state image device includes a color filter formed on a first substrate, and a plurality of first height difference portions formed on the first substrate, and at least one of the first height difference portions is placed a first interval away from the other first height difference portions.

An electronic device according to a third aspect of the present disclosure includes: a color filter formed on a first substrate; and a plurality of first height difference portions formed on the first substrate, wherein at least one of the first height difference portions is placed a first interval away from the other first height difference portions.

The third aspect of the present disclosure includes a color filter formed on a first substrate, and a plurality of first height difference portions formed on the first substrate. At least one of the first height difference portions is placed a first interval away from the other first height difference portions.

A solid-state image device according to a fourth aspect of the present disclosure includes: a color filter formed on a first substrate; and a plurality of first height difference portions formed into a quadrangular prism on the first substrate, wherein a predetermined first height difference portion of the first height difference portions is placed so that a first corner nearest to a first position among corners of the predetermined height difference portion, a second corner placed on a first side of a second first height difference portion on which a third corner nearest to the first position is also placed, and the first position are arranged in a straight line, and a fourth corner placed on a second side on which the first corner nearest to the first position among the corners of the predetermined height difference portion is also placed, the third corner of the second first height difference portion nearest to the first position, and the first position are arranged in a straight line.

The fourth aspect of the present disclosure includes a color filter formed on a first substrate, and a plurality of first height difference portions formed into a quadrangular prism on the substrate. A predetermined first height difference portion of the first height difference portions is placed so that the corner nearest to a first position among the corners of the predetermined first height difference portion, the corner placed on the same side of the other first height difference portion as the corner nearest to the first position, and the first position are arranged on a straight line; and the corner placed on the same side as the corner nearest to the first position among the corners of the predetermined first height difference portion, the corner of the other first height difference portion nearest to the first position, and the first position are arranged on a straight line.

A solid-state image device according to a fifth aspect of the present disclosure includes: a color filter formed on a first substrate; and a height difference portion formed into a ring-shaped solid on the first substrate so that the height difference portion surrounds the color filter.

The fifth aspect of the present disclosure includes a color filter formed on a first substrate, and a height difference portion formed into a ring-shaped solid on the first substrate so that the height difference portion surrounds the color filter.

Effects of the Invention

According to the first to fifth aspects of the present disclosure, uneven application can be reduced. According to the first to fifth aspects of the present disclosure, uneven application of a color filter can be reduced.

Note that the effects of the invention are not necessarily limited to the effects described herein and can be any one of the effects described herein.

MODE FOR CARRYING OUT THE INVENTION

The precondition for the present disclosure and the modes for carrying out the present disclosure (hereinafter, referred to as embodiments) will be described hereinafter. Note that the embodiments will be described in the following order.

1. First Embodiment: Backside Illumination CMOS Image Sensor with Layer Structure (FIGS. 1 to 15)
2. Second Embodiment: Backside Illumination CMOS Image Sensor with Layer Structure (FIGS. 16 to 26)
3. Third Embodiment: Backside Illumination CMOS Image Sensor with Layer Structure (FIGS. 27 to 33)
4. Fourth Embodiment: CCD Image Sensor (FIGS. 34 to 36)
5. Fifth Embodiment: Imaging Device (FIG. 37)

<First Embodiment>

(Exemplary Configuration of First Embodiment of CMOS Image Sensor)

Figure 1:
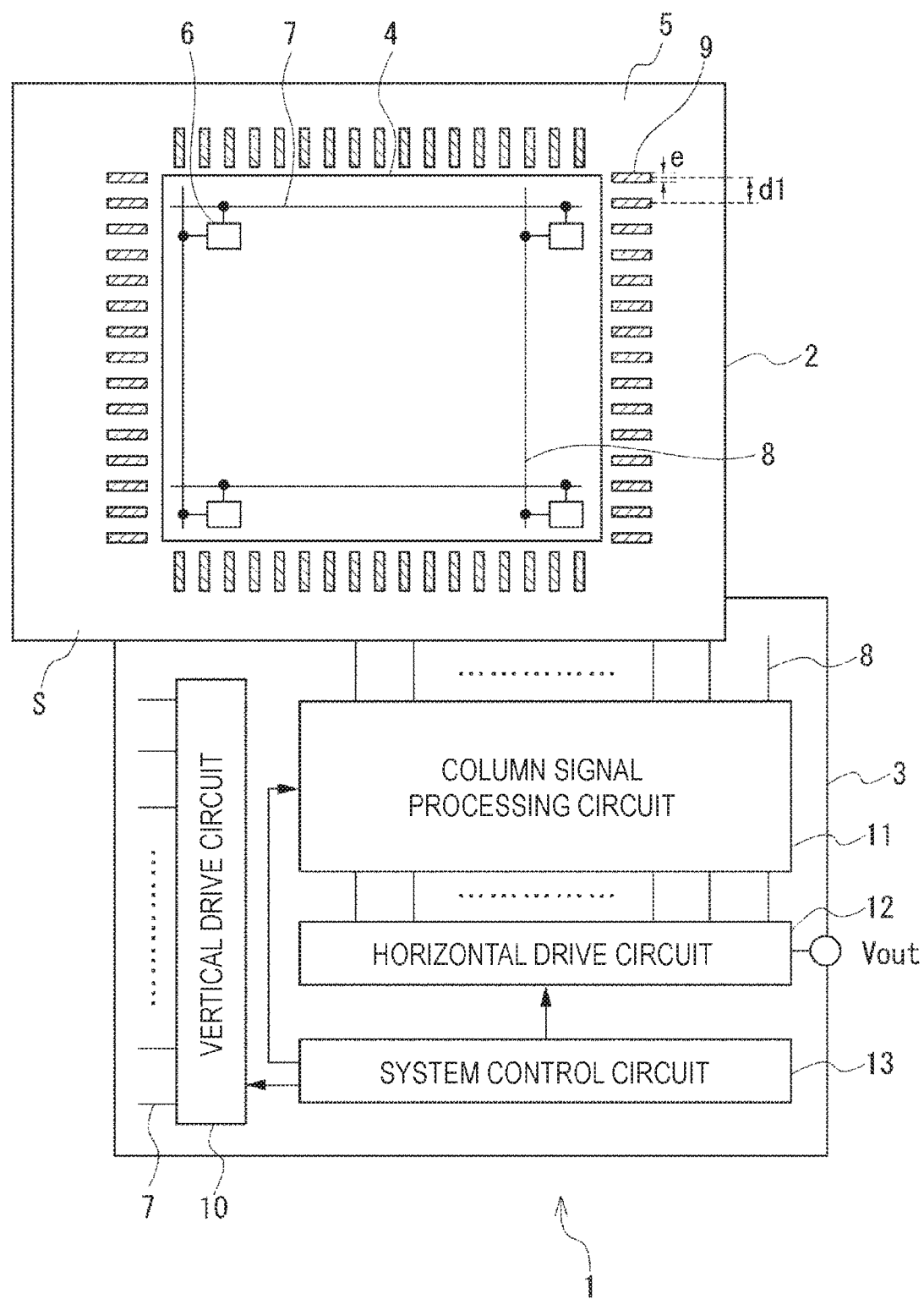
FIG. 1 is a schematic diagram of an exemplary configuration of a first embodiment of a CMOS image sensor to be described as a solid-state image device using the present disclosure.

FIG. 1 is a schematic diagram of an exemplary configuration of a first embodiment of a CMOS image sensor to be described as a solid-state image device using the present disclosure.

A CMOS image sensor 1 illustrated in FIG. 1 is a backside illumination solid-state image device with a layer structure, which is manufactured in a manner in which an opto-electronic converter is formed on a light-receptive surface S of a sensor board 2, a drive circuit is formed on a circuit board 3, and the opposite surface to the light-receptive surface S is stuck to the circuit board 3.

The sensor board 2 includes a central pixel area 4 and a peripheral area 5 placed around the pixel area 4. The pixel area 4 is an area in which pixels 6, each of which includes an opto-electronic converter that generates electric charge in accordance with the intensity of incident light and accumulates the electric charge therein, are two-dimensionally arranged in a matrix. The pixel area 4 also includes a plurality of pixel drive lines 7 wired in rows and a plurality of vertical signal lines 8 wired in columns. Each of the pixels 6 includes, for example, an opto-electronic converter, an electric charge accumulation unit, a plurality of Metal-Oxide-Semiconductor Field-Effect Transistors (MOSFETs), and a capacitive element, and is connected to the pixel drive line 7 and the vertical signal line 8.

In the peripheral area 5, a plurality of connection unit areas 9, each of which is formed in a quadrangular prism, is arranged as height difference portions along the sides of the pixel area 4 on the sensor board 2. The connection unit area 9 includes a plurality of connecting units (to be described below) that connects the pixels 6, pixel drive lines 7, and vertical signal lines 8 provided on the sensor board 2 to drive circuits provided on the circuit board 3. The connection unit areas 9 are arranged at predetermined intervals d1 in a direction so as to be separate from each other. The interval d1 is longer than or equal to a length e of a connection unit area 9 in a direction in which the connection unit areas 9 are arranged at the intervals d1.

The circuit board 3 includes the drive circuits to drive each of the pixels 6 provided on the sensor board 2, for example, a vertical drive circuit 10, a column signal processing circuit 11, a horizontal drive circuit 12, and a system control circuit 13 on the side facing the sensor board 2. The drive circuits are connected to desired wires on the sensor board 2 by the connection units of the connection unit areas 9.

The vertical drive circuit 10 includes, for example, a shift register or an address decoder so as to drive the pixels 6 provided on the sensor board 2 row by row. Output terminals (not illustrated) on the vertical drive circuit 10, each of which is for each row, are connected to first ends of the pixel drive lines 7. The drawing of the concrete configuration of the vertical drive circuit 10 is omitted. However, the vertical drive circuit 10 includes two scanning systems: a read scanning system; and a discharge scanning system.

The read scanning system sequentially selects the rows so as to read the pixel signal from each of the pixels 6 row by row, and outputs the selected pulse from the output terminal connected to the pixel drive line 7 of the selected row.

The discharge scanning system outputs the control pulse from the output terminal connected to the pixel drive line 7 of each row prior to the scanning by the read scanning system by the length of time of the shutter speed in order to discharge (reset) unnecessary electric charge from the opto-electronic conversion element. By the scanning by the discharge scanning system, the so-called electronic shutter operation is sequentially performed row by row. The electronic shutter operation means herein the operation in which the electric charge in the opto-electronic conversion element is discharged and exposure newly starts (accumulation of electric charge starts).

The pixel signal corresponding to the amount of received light output from each pixel of the row selected by the read scanning system of the vertical drive circuit 10 is provided to the column signal processing circuit 11 through each of the vertical signal lines 8.

The column signal processing circuit 11 includes a signal processing circuit for each column of the pixels 6. Each signal processing circuit of the column signal processing circuit 11 process the pixel signal output from each pixel of the selected row through the vertical signal line 8 in a signal process, for example, in a noise removal process such as a Correlated Double Sampling (CDS) process, or in an A/D conversion process. By the CDS process, fixed-pattern noise specific to pixels such as reset noise or variation in thresholds of the amplifier transistor is removed. The column signal processing circuit 11 temporarily stores the pixel signal processed by the signal process.

The horizontal drive circuit 12 includes, for example, a shift register or an address decoder so as to sequentially select the signal processing circuits of the column signal processing circuit 11. By the scanning for selection by the horizontal drive circuit 12, the pixel signals processed by each signal processing circuit of the column signal processing circuit 11 in the signal process are sequentially output from an output terminal Vout.

The system control circuit 13 includes, for example, a timing generator that generates various timing signals so as to control the vertical drive circuit 10, the column signal processing circuit 11, and the horizontal drive circuit 12 in accordance with the various timing signals generated by the timing generator.

In the present embodiment, the vertical drive circuit 10, the column signal processing circuit 11, and the horizontal drive circuit 12 are provided on the circuit board 3. Note that, however, these circuits can be provided on the sensor board 2 and only the system control circuit 13 is provided on the circuit board 3. In other words, the circuit to be formed on the circuit board 3 can variously be selected.

(Exemplary Configuration of Connection Unit Area)

Figure 2:
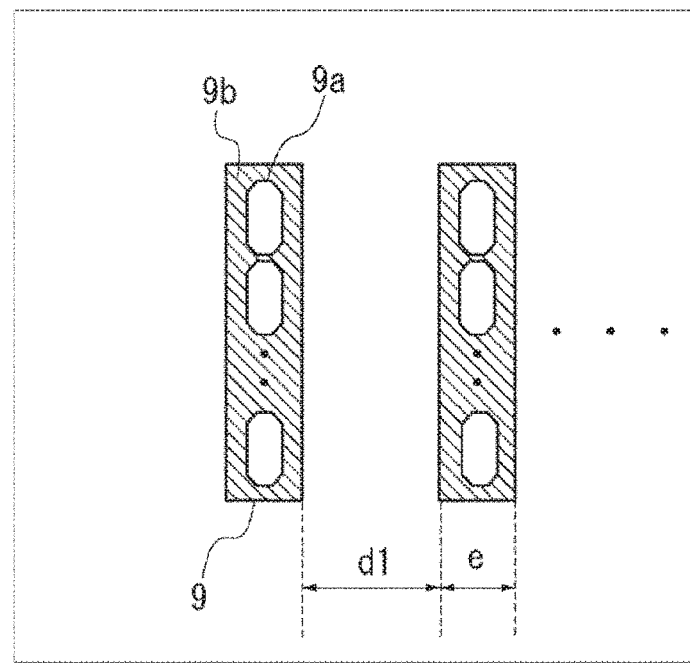
FIG. 2 is a diagram of an exemplary configuration of a connection unit area 9.

FIG. 2 is a diagram of an exemplary configuration of the connection unit areas 9, viewed from above the light-receptive surface S of the connection unit areas 9.

In the connection unit area 9 illustrated in FIG. 2, connection units 9a are arranged at intervals shorter than the interval d1 (in the example of FIG. 2, the interval is approximately zero) in a direction perpendicular to the direction in which the connection unit areas 9 are arranged while the longitudinal side of the connection unit 9a is perpendicular to the direction in which the connection unit areas 9 are arranged. On the other hand, only a connection unit 9a is placed in the direction in which the connection unit areas 9 are arranged. A peripheral unit 9b is formed around the connection units 9a in the connection unit area 9.

(Exemplary Configuration of Connection Unit)

Figure 3:
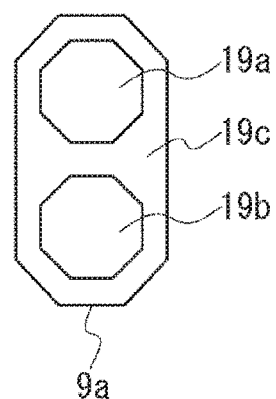
FIG. 3 is a diagram of an exemplary configuration of a connection unit.

FIG. 3 is a diagram of an exemplary configuration of the connection unit 9a, viewed from above the light-receptive surface S of the connection unit 9a.

The connection unit 9a of FIG. 3 includes an electrode 19a connected to a wiring layer of the sensor board 2, penetration electrode 19b connected to a wiring layer of the circuit board 3, and a wiring unit 19c that connects the electrode 19a and the penetration electrode 19b.

(Cross-sectional Surface of CMOS Image Sensor)

Figure 4:
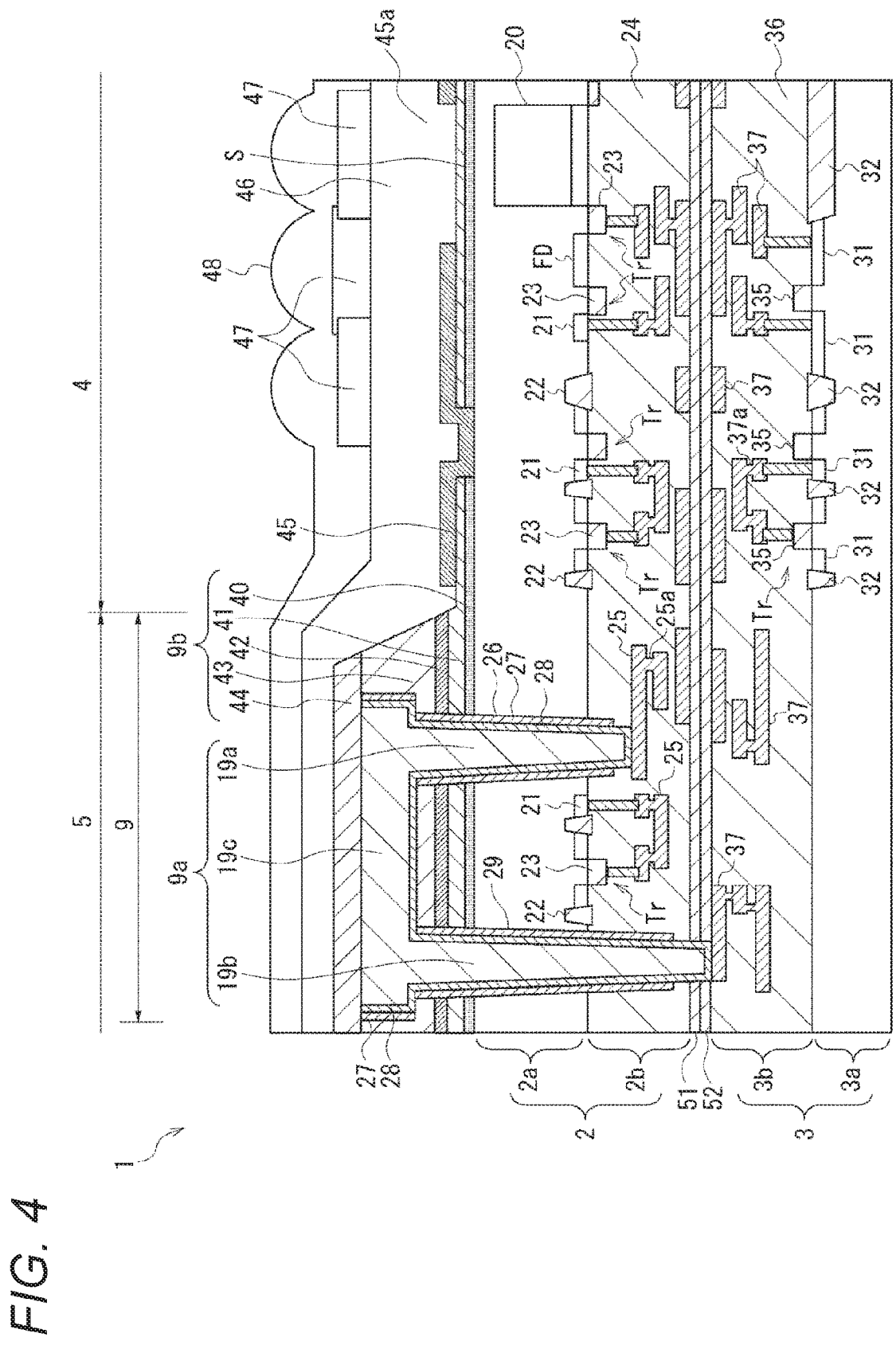
FIG. 4 is a cross-sectional view of a part of the CMOS image sensor illustrated in FIG. 1.

FIG. 4 is a cross-sectional view of a part of the CMOS image sensor 1 illustrated in FIG. 1.

In the CMOS image sensor 1 as illustrated in FIG. 4, the connection unit 9a electrically connects the sensor board 2 and the circuit board 3 stuck to the opposite surface to the light-receptive surface S of the sensor board 2.

The sensor board 2 includes a semiconductor layer 2a and a wiring layer 2b. The semiconductor layer 2a is, for example, a thinned monocrystal silicon semiconductor substrate. Opto-electronic converters 20 corresponding to the pixels 6, respectively, are arranged in a two-dimensional array form along the light-receptive surface S in the pixel area 4 in the semiconductor layer 2a. Each opto-electronic converter 20 is formed, for example, by layering an n-type diffusion layer and a p-type diffusion layer. Note that only the cross-sectional surface of an opto-electronic converter for a pixel is illustrated in FIG. 4.

A floating diffusion area FD that is an n+-type impurity layer, source/drain areas 21 of pixel transistors Tr, and element separation units 22 that separate the pixels 6 are formed on the opposite surface to the light-receptive surface S of the semiconductor layer 2a. The electrode 19a and penetration electrode 19b included in the connection unit 9a are formed in the connection unit area 9 of the semiconductor layer 2a.

The wiring layer 2b includes gate electrodes 23 of the pixel transistors Tr, each of which is provided on the opposite surface to the light-receptive surface S of the semiconductor layer 2a through a gate insulator (not illustrated), and multi-layer (three-layer in FIG. 4) wires 25, each of which is layered through the inter-layer insulator 24 on the gate electrode 23. The wires 25 are made, for example, of copper (Cu). A wire 25 and a wire 25, and a wire 25 and a pixel transistor Tr are connected through vias 25a if necessary. The electric charge of signal accumulated in the opto-electronic converter 20 of each pixel 6 is read through the pixel transistor Tr and the wire 25.

An insulating protection film 51 covering the highest layer of the wire 25 (the wire 25 farthest from the semiconductor layer 2a) is provided on the opposite surface to the surface in contact with the semiconductor layer 2a of the wiring layer 2b. The surface of the protection film 51 is the sticking surface on which the sensor board 2 is stuck to the circuit board 3.

The circuit board 3 includes a semiconductor layer 3a and a wiring layer 3b. The semiconductor layer 3a is, for example, a thinned monocrystal silicon semiconductor substrate. For example, source/drain areas 31 of transistors Tr and element separation units 32 are formed on a side of the semiconductor layer 3a facing the sensor board 2.

The wiring layer 3b includes gate electrodes 35 of the transistors Tr, each of which is provided on the surface in contact with the semiconductor layer 3a through a gate insulator (not illustrated), and multi-layer (three-layer in FIG. 4) wires 37, each of which is layered through the inter-layer insulator 36 on the gate electrode 35. The wires 37 are made, for example, of copper (Cu). A wire 37 and a wire 37, and a wire 37 and a pixel transistor Tr are connected through vias 37a if necessary. The drive circuit includes the transistors Tr and wires 37 provided in the wiring layer 3b. The penetration electrode 19b is connected to the wiring layer 3b in the connection unit area 9.

An insulating protection film 52 covering the highest layer of the wire 37 (the wire 37 farthest from the semiconductor layer 3a) is provided on the opposite surface to the surface in contact with the semiconductor layer 3a of the wiring layer 3b. The surface of the protection film 52 is the sticking surface on which the sensor board 2 is stuck to the circuit board 3.

The electrode 19a of the connection unit 9a has a form to penetrate the semiconductor layer 2a from the light-receptive surface S of the semiconductor layer 2a and be connected to the lowest layer of the wire 25 (the wire 25 nearest to the semiconductor layer 2a) in the wiring layer 2b. Specifically, the electrode 19a is made of a conductive material embedded through the separation insulator 27 and the barrier metal film 28 in a connection hole 26 configured to expose the lowest layer of the wire 25 in the wiring layer 2b from the light-receptive surface S of the semiconductor layer 2a. The electrode 19a electrically connects the lowest layer of the wire 25 in the wiring layer 2b and the wiring unit 19c.

The penetration electrode 19b is formed near the electrode 19a so as to penetrate the semiconductor layer 2a and the wiring layer 2b from the light-receptive surface S of the semiconductor layer 2a and be connected to the highest layer of the wire 37 (the wire 37 farthest from the semiconductor layer 3a) in the wiring layer 3b. Specifically, the penetration electrode 19b is made of a conductive material embedded through the separation insulator 27 and the barrier metal film 28 in a connection hole 29 configured to expose the highest layer of the wire 37 in the wiring layer 3b from the light-receptive surface S of the semiconductor layer 2a. The penetration electrode 19b electrically connects the highest layer of the wire 37 in the wiring layer 3b and the wiring unit 19c.

The wiring unit 19c is made of a conductive material on the semiconductor layer 2a. The wiring unit 19c electrically connects the electrode 19a and the penetration electrode 19b. This connection electrically connects the sensor board 2 and the circuit board 3.

The electrode 19a, the penetration electrode 19b, and the wiring unit 19c can be made of a conductive material, for example, copper (Cu), aluminum (Al), or tungsten (W). However, copper (Cu) is used as the conductive material in this example.

The peripheral unit 9b is an insulating layer formed on the light-receptive surface S of the semiconductor layer 2a and embedding the connection unit 9a therein. The film thickness of the peripheral unit 9b is gradually thinned from the connection unit area 9 toward the pixel area 4. In other words, the peripheral unit 9b has inclined side surfaces in a tapered form. The peripheral unit 9b is a five-layer insulating film manufactured in a manner in which an anti-reflection film 40, an interface state generation suppression film 41, an etching stop film 42, an upper insulator 43, and a cap film 44 are layered in order from the light-receptive surface S of the sensor board 2.

The anti-reflection film 40 is made of an insulating material, such as hafnium oxide (HfO2), tantalum oxide (Ta2O5), or silicon nitride, with a higher refractive index than that of silicon oxide. The interface state generation suppression film 41 is made, for example, of silicon oxide (SiO2). The etching stop film 42 is made of a material, such as silicon nitride (SiN), with a lower etching selectivity than that of the upper insulator 43. The upper insulator 43 is made, for example, of silicon oxide (SiO2). The cap film 44 is made, for example, of silicon carbonitride (SiCN), or silicon nitride (SiN).

Note that the anti-reflection film 40 and interface state generation suppression film 41 in the peripheral unit 9b extend to the light-receptive surface S of the semiconductor layer 2a in the pixel area 4. In other words, the insulating layer has five layers in the peripheral area 5 but has two layers in the pixel area 4. This causes a height difference.

The light blocking film 45 is formed on the interface state generation suppression film 41 in the pixel area 4. The light blocking film 45 includes a plurality of light receptive openings 45a, each of which is provided in the area above the opto-electronic converter 20 of each pixel 6, so as to block the light between the adjacent pixels 6.

The light blocking film 45 is made of a conductive material with a high light-blocking effect such as tungsten (W), aluminum (Al), or Ti (titanium), TiN (titanium nitride), Cu (copper), or Ta (tantalum), or a multi-layer film thereof.

The planarization film 46 is configured to cover the upper parts of the light blocking film 45 and peripheral unit 9b in order to planarize the peripheral area 5 and the pixel area 4. This planarization decreases the height difference between the peripheral area 5 and the pixel area 4. The planarization film 46 is made, for example, of acrylic resin.

A color filter 47 is formed on the planarization film 46, corresponding to the opto-electronic converter 20 of each pixel 6. The color filter 47 is made of a filter layer that selectively allows a light, for example, red (R), green (G), or blue (B) to pass through. The colors of the color filters 47 are arranged, for example, in Bayer layout. The color filter 47 allows a light of R, G, or B to pass through and enter the opto-electronic converter 20 in the semiconductor layer 2a.

Herein, the color of the light passing through the color filter 47 is one of R, G, and B. Note that, however, the color can be another color, for example, cyan, yellow, or magenta.

An on-chip lens 48 is formed on the color filter 47 of each pixel 6. The on-chip lens 48 collects the incident light and allows the collected light to enter the opto-electronic converter 20 through the color filter 47.

(Description of Height Difference of Planarization Film)

Figure 5:
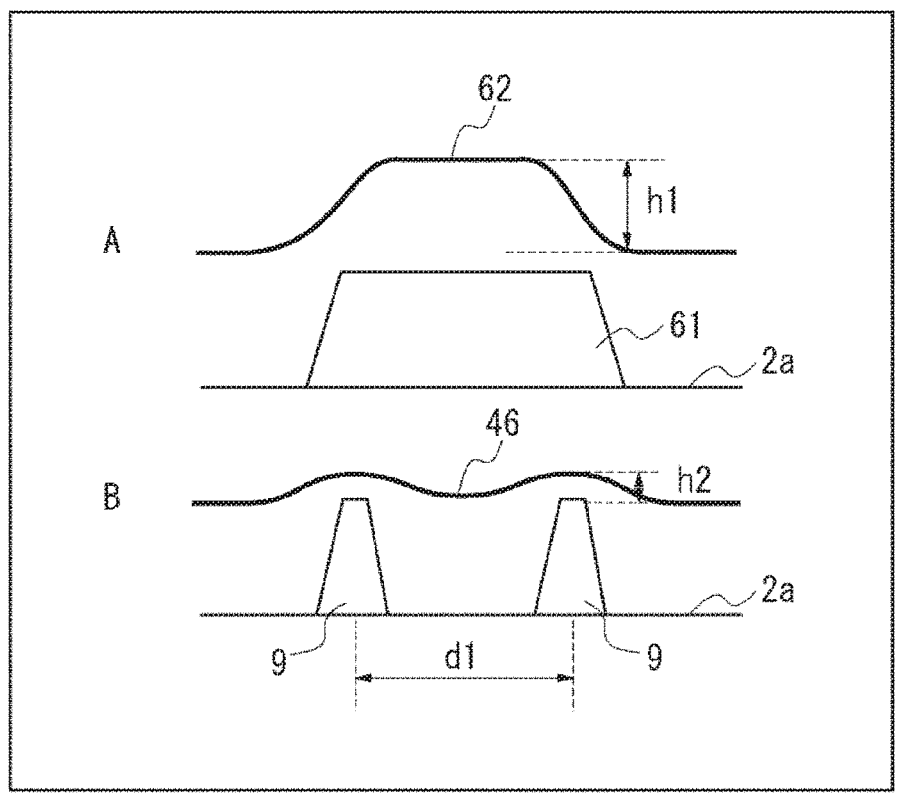
FIG. 5 is an explanatory cross-sectional view of a height difference of a planarization film caused by a connection unit area.

FIG. 5 is an explanatory cross-sectional view of height differences of the planarization film 46 caused by the connection unit area 9.

When the connection unit areas are arranged at intervals shorter than the interval d1 (zero in this example), the continuously arranged connection unit areas form a connection unit area 61 extending in a direction in which the connection unit areas are arranged as illustrated in A of FIG. 5. In other words, the area of the upper part of the connection unit area 61 is relatively large. Accordingly, as illustrated in A of FIG. 5, the height difference caused by the connection unit area 9 is transferred onto the planarization film 62 configured to cover the upper part of the connection unit area 61, and thus a height difference h1 of the planarization film 62 is relatively large.

On the other hand, the connection unit areas 9 are arranged at the intervals d1 in the CMOS image sensor 1. Thus, the connection unit areas 9 are not continuously arranged. Thus, the area of the upper part of each connection unit area 9 is relatively small. Accordingly, the planarization film 46 configured to cover the upper part of the connection unit areas 9 lessens the height differences in comparison with the height difference caused by the connection unit area 61 as illustrated in B of FIG. 5. A height difference h2 of the planarization film 46 is smaller than the height difference h1.

(Method for Manufacturing CMOS Image Sensor)

FIGS. 6 to 9 are explanatory diagrams of a method for manufacturing the CMOS image sensor 1.

Figure 6:
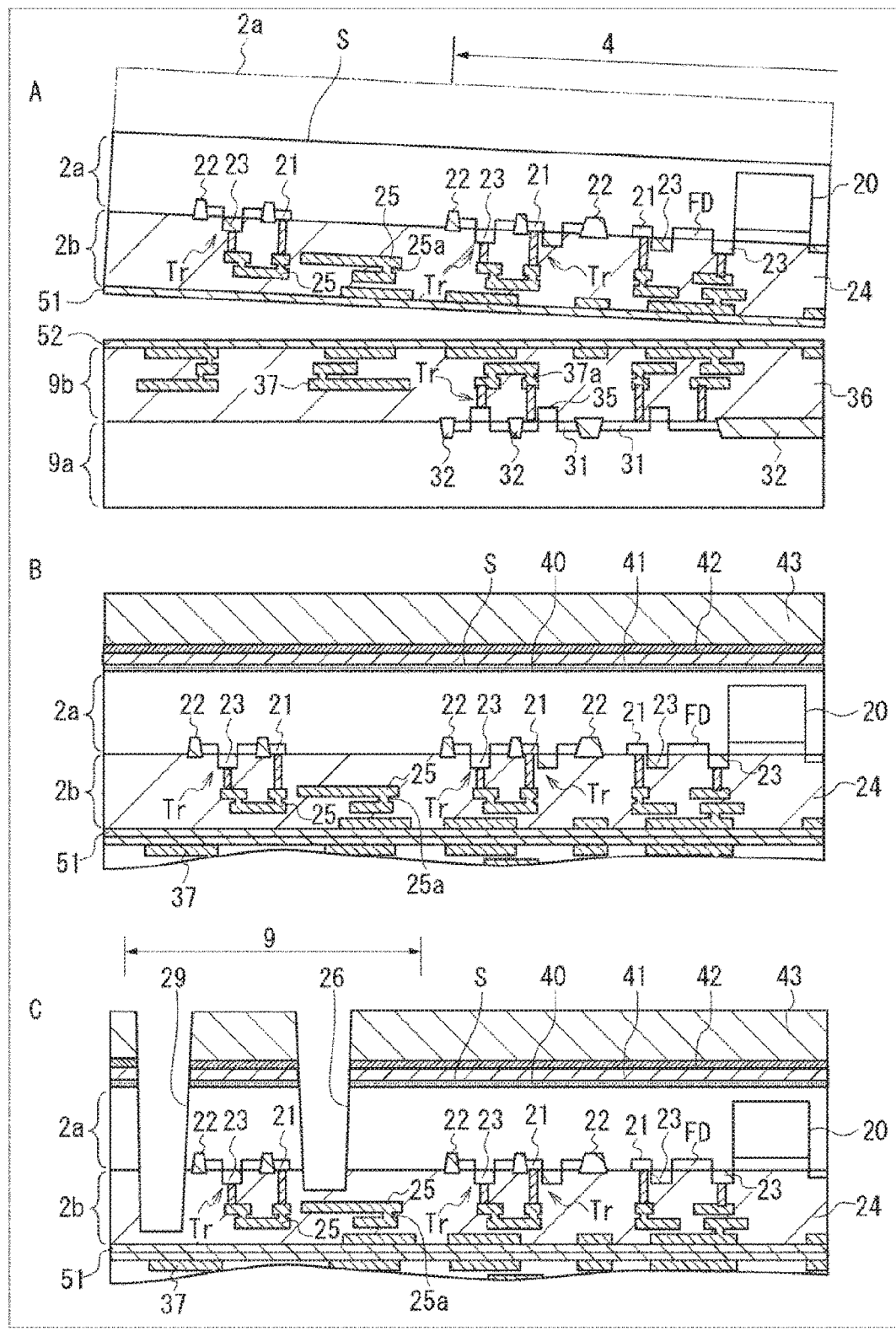
FIG. 6 is an explanatory diagram of a method for manufacturing a CMOS image sensor.

As illustrated in A of FIG. 6, the semiconductor layer 2a is prepared first. By implanting ions from the surface of the pixel area 4 of the semiconductor layer 2a (the opposite surface to the light-receptive surface S), a plurality of opto-electronic converters 20 is formed. By implanting ions from the surfaces of desired areas of the semiconductor layer 2a, the floating diffusion area FD, the source/drain areas 21, and the element separation units 22 are formed.

Next, the gate electrodes 23 are formed on the semiconductor layer 2a through gate insulators (not illustrated). The multi-layer (three-layer in A of FIG. 6) wires 25 are formed above the gate electrodes 23 through the inter-layer insulator 24. Meanwhile, vertical holes are formed in the inter-layer insulator 24 and a conductive material is embedded in the vertical holes. This forms the vias 25a. After that, the protection film 51 is formed on the inter-layer insulator 24.

On the other hand, the semiconductor layer 3a is prepared separately from the semiconductor layer 2a. By implanting ions from a first surface of the semiconductor layer 3a, the source/drain areas 31 and the element separation units 32 are formed on the first surface.

Next, the gate electrodes 35 are formed on the first surface of the semiconductor layer 3a through gate insulators (not illustrated). The multi-layer (three-layer in A of FIG. 6) wires 37 are formed above the gate electrodes 35 through the inter-layer insulator 36. Meanwhile, vertical holes are formed in the inter-layer insulator 36 and a conductive material is embedded in the vertical holes. This forms the vias 37a. After that, the protection film 52 is formed on the inter-layer insulator 36.

The surface of the sensor board 2 on which the protection film 51 is formed is faced to the surface of the circuit board 3 on which the protection film 52 is formed. Then, the sensor board 2 is stuck to the circuit board 3. After the sticking, the light-receptive surface S of the semiconductor layer 2a is thinned if necessary.

Next, as illustrated in B of FIG. 6, the anti-reflection film 40, the interface state generation suppression film 41, the etching stop film 42, and the upper insulator 43 are layered in order and formed into films on the light-receptive surface S of the semiconductor layer 2a. As the anti-reflection film 40, for example, hafnium oxide is formed into a film having a film thickness of 10 nm to 300 nm (for example, 60 nm) in an atomic layer deposition method. As the interface state generation suppression film 41, for example, SiO2 is formed into a film having a film thickness of 200 nm in a Plasma-Chemical Vapor Deposition (P-CVD) method. As the etching stop film 42, for example, silicon nitride (SiN) is formed into a film having a film thickness of 50 to 200 nm in a P-CVD method. As the upper insulator 43, for example, silicon oxide is formed into a film having a film thickness of 200 nm in a P-CVD method.

Next, as illustrated in C of FIG. 6, by etching the connection unit area 9, for example, using a resist pattern as a mask, the connection hole 26 is formed with a depth from the upper insulator 43 to a position not enough deep to reach the lowest layer (the layer nearest to the semiconductor layer 2a) of the wire 25 of the wiring layer 2b. By etching the connection unit area 9, for example, using a resist pattern as a mask, the connection hole 29 is also formed with a depth from the upper insulator 43 to a position not enough deep to reach the highest layer (the layer farthest from the semiconductor layer 2a) of the wire 25 of the wiring layer 2b.

Figure 7:
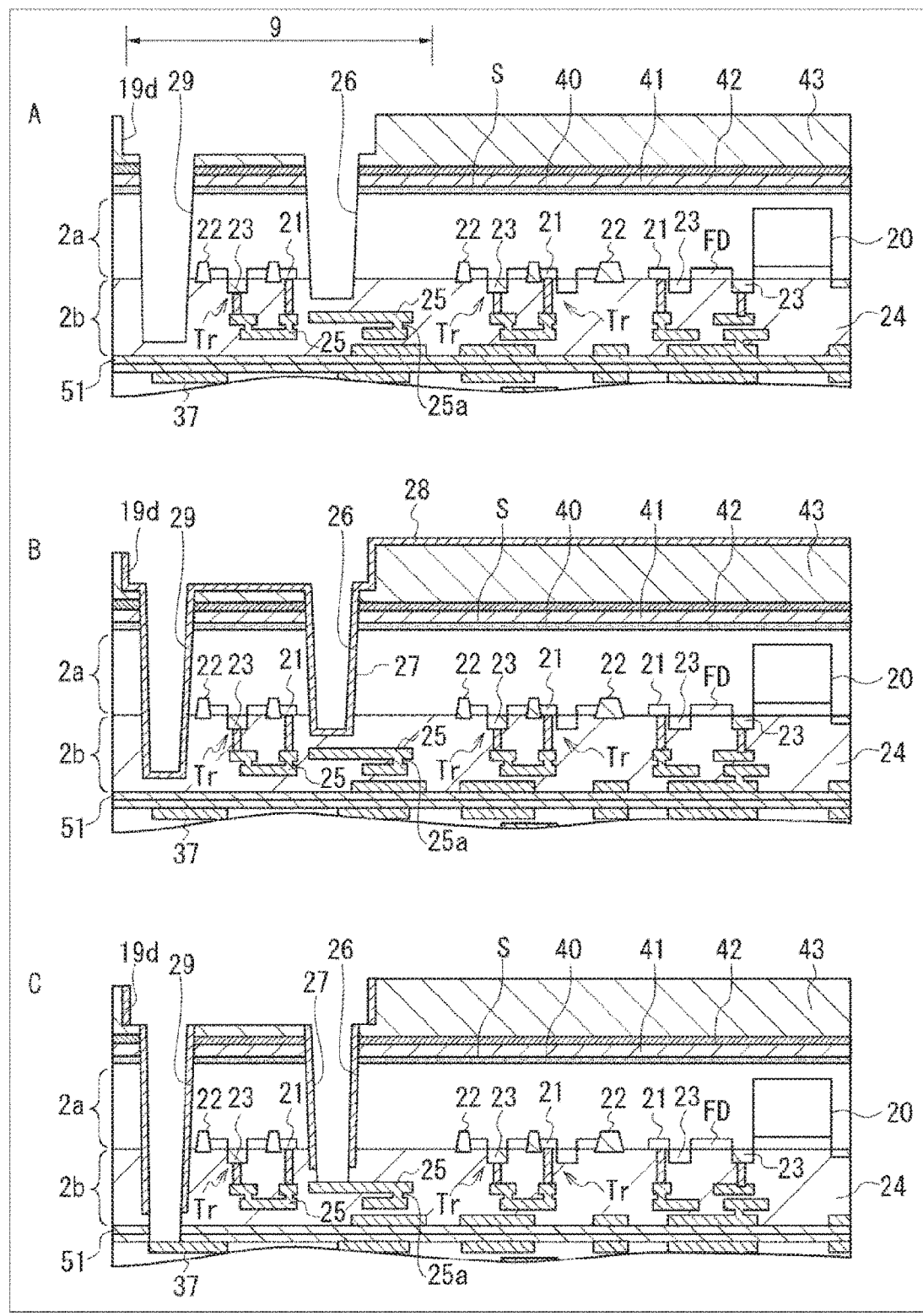
FIG. 7 is an explanatory diagram of a method for manufacturing a CMOS image sensor.

Next, as illustrated in A of FIG. 7, by etching, for example, the connection unit area 9 using a resist pattern as a mask, the connection hole 19d is formed with a depth not deep enough to reach the etching stop film 42 in an area including the connection hole 26 and the connection hole 29 in the upper insulator 43.

Next, as illustrated in B of FIG. 7, the separation insulator 27 is formed into a film so as to cover the inner walls of the connection hole 26, connection hole 29, and connection hole 19d. As the separation insulator 27, for example, silicon oxide is formed into a film having a film thickness of 100 to 1000 nm in a P-CVD method. The separation insulator 27 electrically separates the electrode 19a formed in the connection hole 26 and the penetration electrode 19b formed in the connection hole 29 from the semiconductor layer 2a.

Next, as illustrated in C of FIG. 7, the separation insulator 27 is removed by the etching under a highly anisotropic etching condition. This etching removes the separation insulator 27 from the bottoms of the connection hole 26 and connection hole 29. The bottoms of the connection hole 26 and connection hole 29 are further dug under the highly anisotropic etching condition. This etching exposes the lowest layer of the wire 25 of the wiring layer 2b to the bottom of the connection hole 26, and exposes the highest layer of the wire 37 of the wiring layer 3b to the bottom of the connection hole 29.

Figure 8:
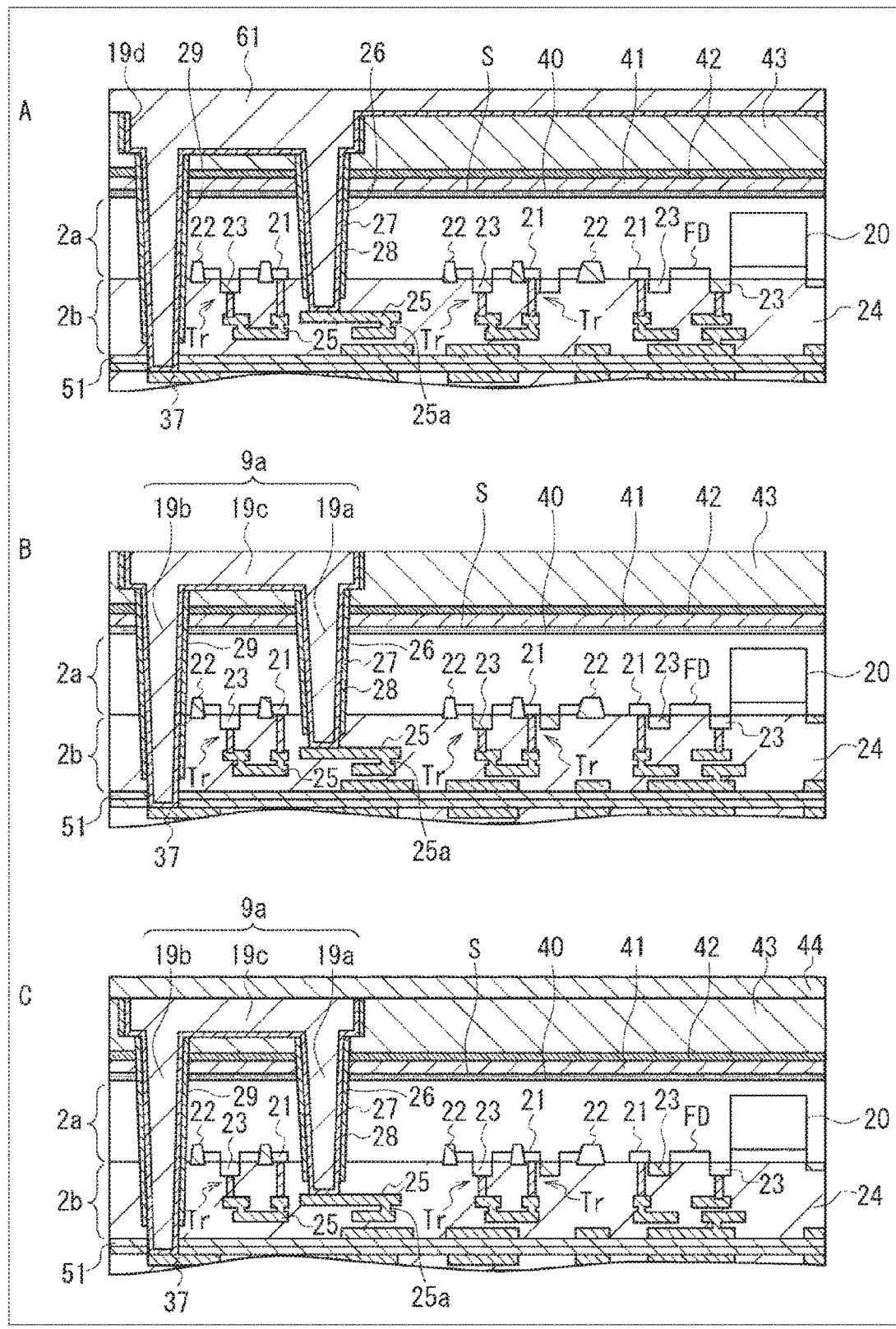
FIG. 8 is an explanatory diagram of a method for manufacturing a CMOS image sensor.

Next, as illustrated in A of FIG. 8, the barrier metal film 28 is formed into a film so as to cover the inner walls of the connection hole 26, connection hole 29, and connection hole 19d. As the barrier metal film 28, for example, tantalum nitride (TaN) is formed into a film having a film thickness of 5 to 100 nm in a PVD method. Subsequently, a conductive material made of copper (Cu) is formed on the barrier metal film 28 in a plating method. This fills the connection hole 26, the connection hole 29, and the connection hole 19d with copper (Cu).

Next, as illustrated in B of FIG. 8, the conductive material layer is ground with a Chemical Mechanical Polishing (CMP) method and the surface of the conductive material layer is planarized until the upper insulator 43 is exposed.

This forms the electrode 19a, the penetration electrode 19b, and the wiring unit 19c electrically connecting the electrode 19a and the penetration electrode 19b. In other words, the connection units 9a are formed in a so-called dual damascene process.

Next, the cap film 44 is formed on the surface of the upper insulator 43. As the cap film 44, for example, silicon nitride (SiN) is formed into a film having a film thickness of 5 to 100 nm in a P-CVD method.

Figure 9:
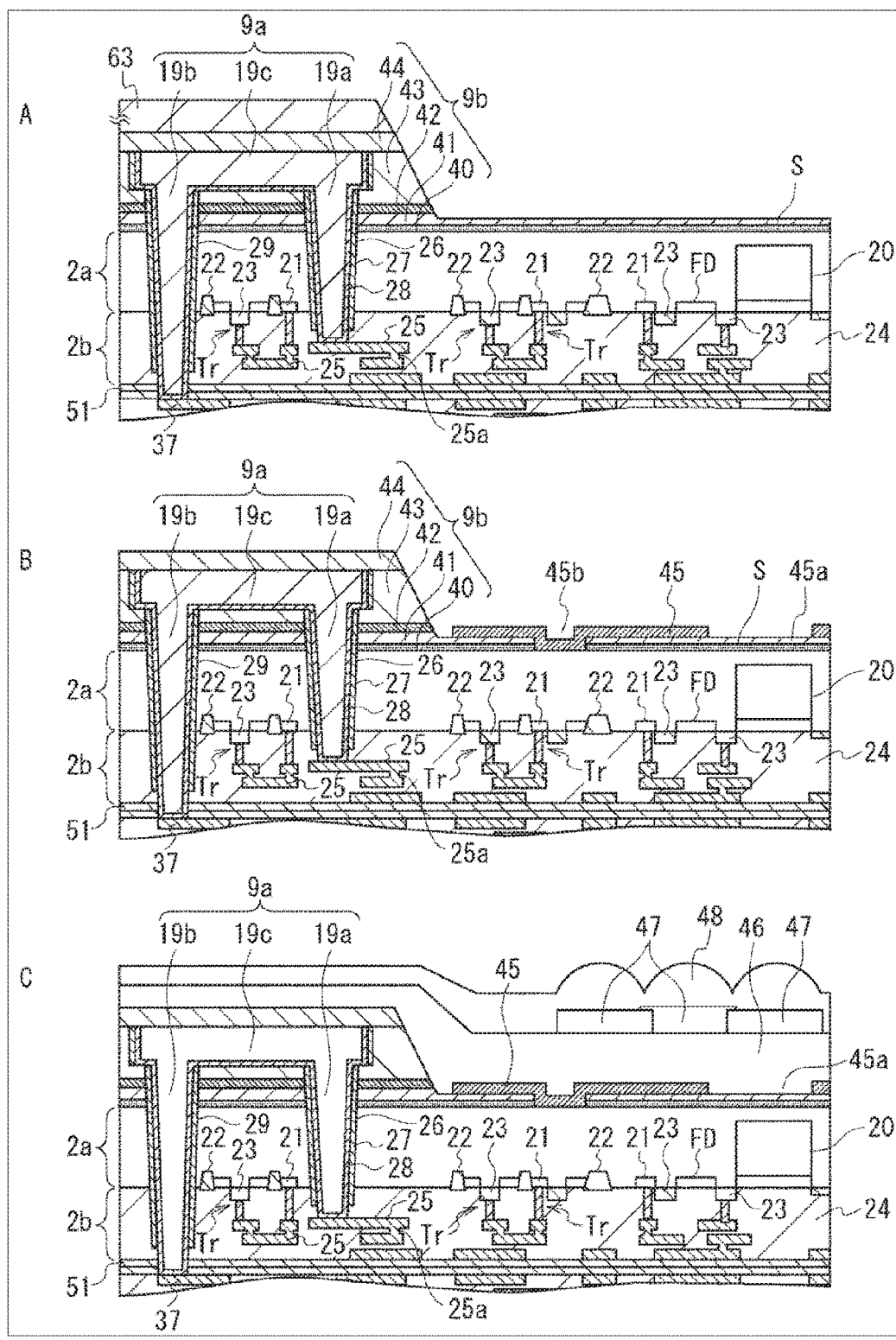
FIG. 9 is an explanatory diagram of a method for manufacturing a CMOS image sensor.

Next, as illustrated in A of FIG. 9, a part of the peripheral unit 9b in the pixel area 4 is thinned selectively from the connection unit area 9. Specifically, first, a resist material layer is formed fully on the peripheral unit 9b, an opening is formed in the area corresponding to the pixel area 4, and the end of the peripheral unit 9b facing the opening is reflowed in a post bake process. This reflow forms the resist pattern 63 on the peripheral unit 9b.

Then, the peripheral unit 9b on the pixel area 4 is removed up to a predetermined depth by the etching using the resist pattern 63 as a mask. In the etching process, the cap film 44 and the upper insulator 43 are etched while the etching condition is changed as needed so that the peripheral unit 9b is gradually thinned from the connection unit area 9 toward the pixel area 4. Then, the etching stops at the etching stop film 42 that is the lower layer than the cap film 44 and the upper insulator 43.

As described above, the etching stop film 42 is formed in the CMOS image sensor 1. The etching irregularity that may be caused when the upper insulator 43 is etched can be cleared once on the surface of the etching stop film 42. This clearance keeps the surface of the interface state generation suppression film 41 above the pixel area 4 even.

After the etching of the upper insulator 43 is completed, the etching condition is changed so that the peripheral unit 9b is gradually thinned from the connection unit area 9 toward the pixel area 4. Then, the etching stop film 42 is etched. When the interface state generation suppression film 41 is exposed, the etching is terminated. As a result, only the anti-reflection film 40 and interface state generation suppression film 41 remain in the pixel area 4 while the five-layer peripheral unit 9b remains in the connection unit area 9 without removal. Meanwhile, the side surface of the peripheral unit 9b is an inclined surface in a tapered form.

Next, as illustrated in B of FIG. 9, the interface state generation suppression film 41 and the anti-reflection film 40 are etched at a predetermined position of the pixel area 4, using a resist pattern (not illustrated) as a mask. This etching forms the opening 45b to expose the semiconductor layer 2a. Note that the opening 45b is formed at a position avoiding the area immediately above the opto-electronic converter 20.

Next, a conductive material made, for example, of tungsten is formed into a film on the interface state generation suppression film 41 in the pixel area 4 with a sputtering film-forming method. This forms the light blocking film 45. After that, the conductive material film is etched by pattern etching using a resist pattern (not illustrated) as a mask. This pattern etching forms the light receptive opening 45a for each opto-electronic converter 20.

Next, as illustrated in C of FIG. 9, the planarization film 46 made of a light-permeable material is formed in an application method such as a spin coating method so as to cover the upper parts of the light blocking film 45 and peripheral unit 9b. Next, a color filter 47 with each color appropriate to the opto-electronic converter 20 is poured and applied from the outside of the connection unit area 9 onto the planarization film 46 in an application method such as a spin coating method.

In this example, as described with reference to FIG. 5, the height difference h2 of the planarization film 46 is smaller than the height difference h1 of the planarization film 62. The uneven application of the color filter 47 caused by the height difference h2 of the planarization film 46 is reduced in comparison with the uneven application caused by the height difference h1 of the planarization film 62. Meanwhile, the side surface of the peripheral unit 9b is an inclined surface in a tapered form. This prevents the fluid pressure of the color filter 47 on the height difference h2 from concentrating when the color filter 47 climbs over the height difference h2. This reduces the uneven application.

After the color filter 47 is applied, the on-chip lens 48 appropriate to the opto-electronic converter 20 is formed on the color filter 47. As described above, the CMOS image sensor 1 is manufactured.

As described above, in the CMOS image sensor 1, the connection unit areas 9 are arranged at the intervals d1 so that the connection unit areas 9 are separate from each other. This arrangement lessens the height difference of the planarization film 46 caused by the connection unit area 9, and thus reduces the uneven application (uneven spraying) of the color filter 47. As a result, yield is improved.

(Other Exemplary Arrangements of Connection Units)

Figure 10:
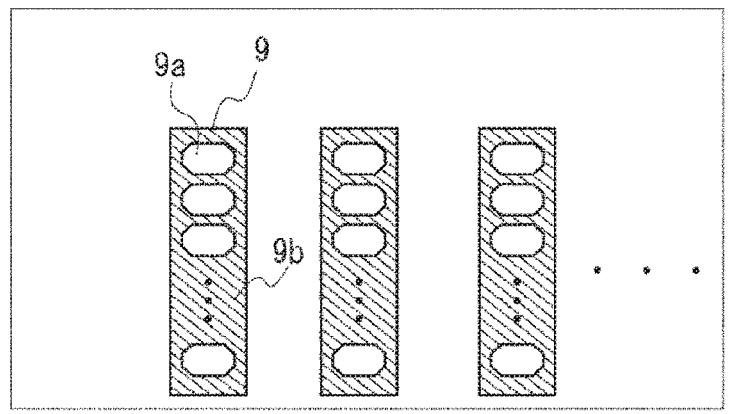
FIG. 10 is a diagram of another exemplary arrangement of the connection units in the connection unit area.
Figure 11:
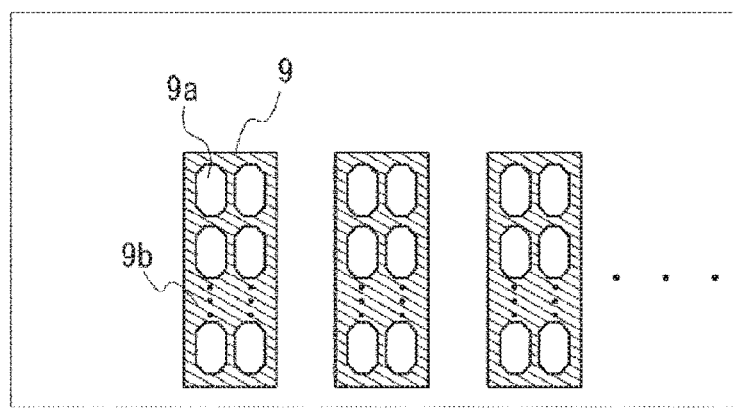
FIG. 11 is a diagram of another exemplary arrangement of the connection units in the connection unit area.
Figure 12:
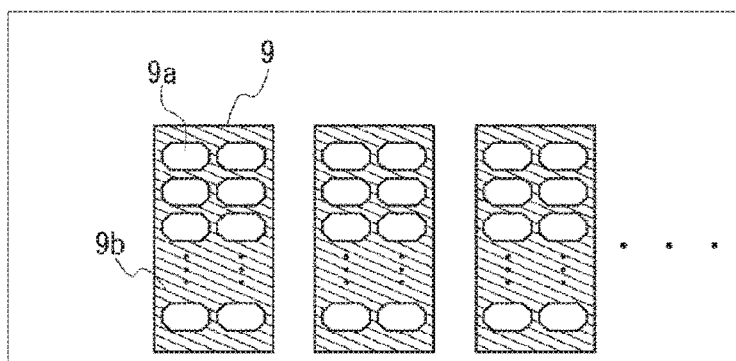
FIG. 12 is a diagram of another exemplary arrangement of the connection units in the connection unit area.

FIGS. 10 to 12 are diagrams of other exemplary arrangements of the connection units 9a in the connection unit area 9.

In the example of FIG. 2, the connection units 9a are arranged in the connection unit area 9 so that the longitudinal side of the connection unit 9a is perpendicular to the direction in which the connection unit areas 9 are arranged. However, as illustrated in FIG. 10, the connection units 9a can be arranged so that the longitudinal side is in the direction in which the connection unit areas 9 are arranged.

In the example of FIG. 2, only a connection unit 9a is placed in the direction in which the connection unit areas 9 are arranged in the connection unit area 9. However, as illustrated in FIG. 11, two or more (two in the example of FIG. 11) connection units 9a can be arranged. In this example, the area of the upper parts of the connection unit areas 9 is larger than the area when only a connection unit 9a is placed. This increases the height difference of the planarization film 62. Thus, the effect of reducing the uneven application of the color filter 47 decreases. However, the area necessary to install the connection unit areas 9 decreases. This can reduce the chip size of the CMOS image sensor 1.

Similarly, even when the longitudinal side of the connection unit 9a in the connection unit area 9 is in the direction in which the connection unit areas 9 are arranged, two or more (two in the example of FIG. 12) connection units 9a can be arranged in the direction in which the connection unit areas 9 are arranged as illustrated in FIG. 12.

(Other Exemplary Arrangements of Connection Unit Areas)

Figure 13:
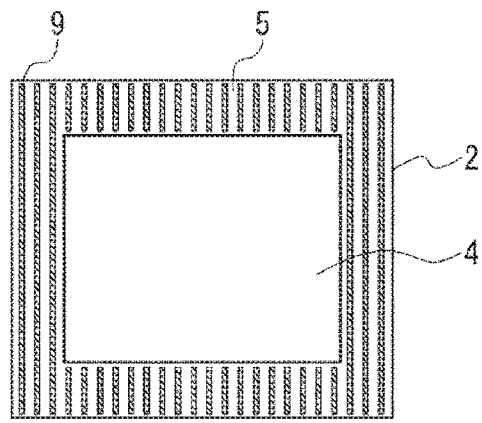
FIG. 13 is a diagram of another exemplary arrangement in the connection unit area.
Figure 14:
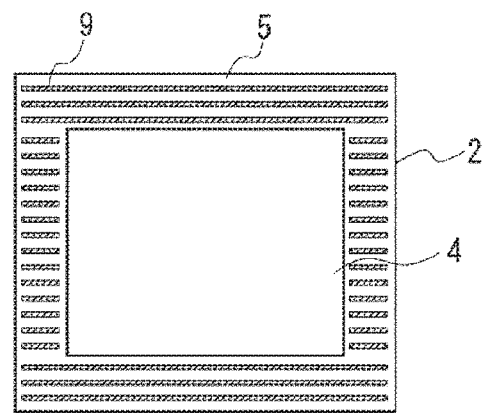
FIG. 14 is a diagram of another exemplary arrangement in the connection unit area.
Figure 15:
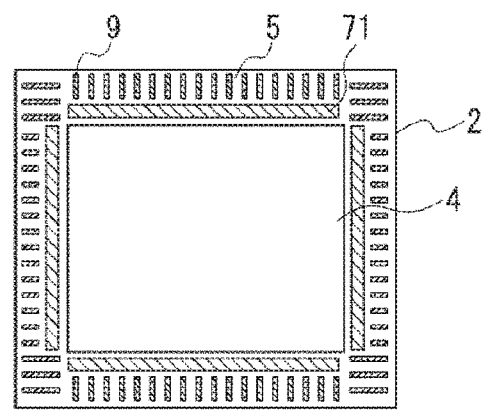
FIG. 15 is a diagram of another exemplary arrangement in the connection unit area.

FIGS. 13 to 15 are diagrams of other exemplary arrangements of the connection unit areas 9.

In the example of FIG. 1, the connection unit areas 9 are arranged along the sides of the pixel area 4. However, as illustrated in FIG. 13, the connection unit areas 9 can be arranged at predetermined intervals d1 in the horizontal direction (lateral direction) of the sensor board 2 in the drawing. Note that, although not illustrated in FIG. 13, the pixels 6, the pixel drive lines 7, and the vertical signal lines 8 are arranged in the pixel area 4, similarly to FIG. 1. These are similarly arranged in the examples to be described below with reference to FIGS. 14 to 27, FIGS. 29 to 34, and FIG. 36.

Alternatively, as illustrated in FIG. 14, the connection unit areas 9 can be arranged at predetermined intervals d1 in the vertical direction (longitudinal direction) of the sensor board 2 in the drawing. Furthermore, as illustrated in FIG. 15, not only the connection unit areas 9 but also connection unit areas 71 can be arranged in the peripheral area 5. The connection unit areas 71 are arranged in intervals of zero along each side of the pixel area 4, and thus extend in the direction of each side of the pixel area 4.

In the description, all the connection unit areas 9 are arranged at predetermined intervals d1 so that the connection unit areas 9 are separate from each other. However, it is only necessary that at least a connection unit area 9 is separate the interval d1 away from the other connection unit areas 9. When at least a connection unit area 9 is separate the interval d1 away from the other connection unit areas 9, the height difference of the planarization film 46 decreases in comparison with the height difference when all the connection unit areas are arranged at intervals shorter than the interval d1. Thus, the uneven application of the color filter 47 decreases.

<Second Embodiment>

(Exemplary Configuration of Second Embodiment of CMOS Image Sensor)

The configuration of the second embodiment of the CMOS image sensor using the present disclosure is similar to the configuration of the CMOS image sensor 1 illustrated in FIG. 1 except for the sensor board 2. Thus, only the sensor board 2 will be described hereinafter.

Figure 16:
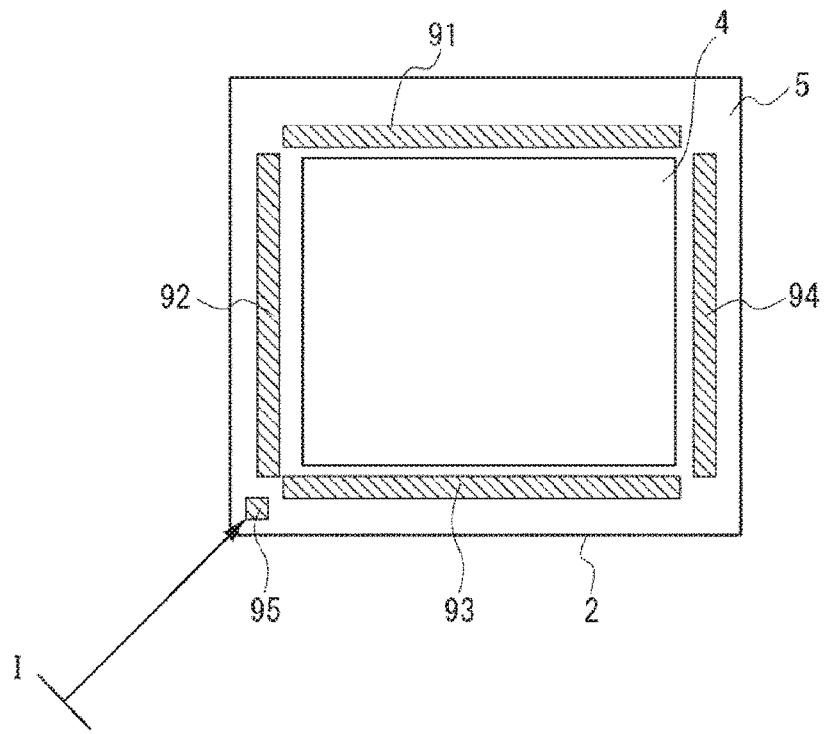
FIG. 16 is a diagram of an exemplary configuration of a sensor board of a second embodiment of a CMOS image sensor using the present disclosure.

FIG. 16 is a diagram of an exemplary configuration of the sensor board of the second embodiment of the CMOS image sensor using the present disclosure.

In the configuration illustrated in FIG. 16, the same components as the components illustrated in FIG. 1 are put with the same reference signs. The overlapping description will be properly omitted.

Differently from the configuration illustrated in FIG. 1, the configuration of a sensor board 2 illustrated in FIG. 16 is provided with connection unit areas 91 to 95 instead of the connection unit areas 9.

The four connection unit areas 91 to 94 are formed along the sides of a pixel area 4, respectively, in a peripheral area 5 on the sensor board 2 illustrated in FIG. 16. Each of the connection unit areas 91 to 94 is formed into a quadrangular prism on the sensor boards 2. A connection unit area 95 is formed on a position nearer to an inlet I of a color filter 47 than the connection unit areas 91 to 94. The inlet I is positioned, for example, at the center of the silicon wafer on which the sensor boards 2 are formed.

Figure 17:
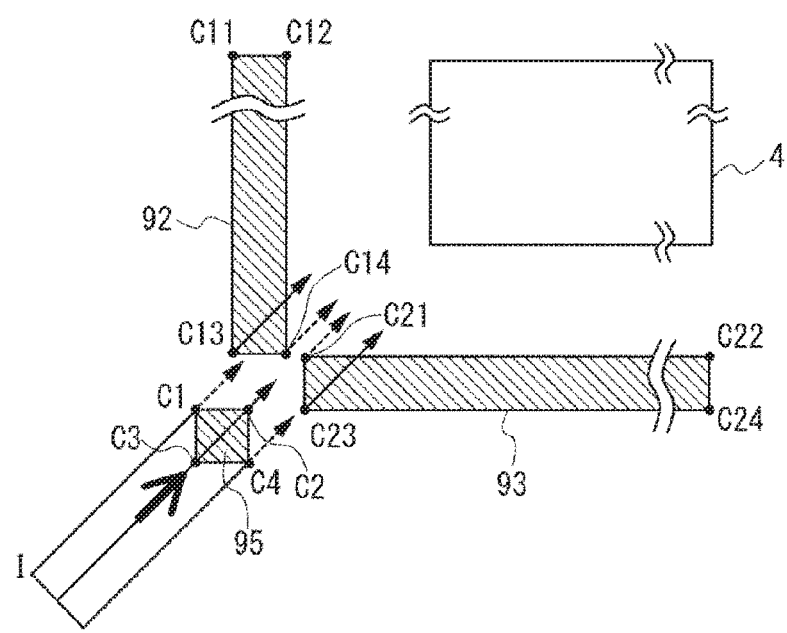
FIG. 17 is an explanatory diagram of a positional relationship in the connection unit area.

FIG. 17 is an explanatory diagram of the positional relationship among the connection unit areas 92, 93, and 95.

In the example of FIG. 17, the inlet I is positioned on the lower left side than the connection unit areas 92 and 93 and the color filter 47 flows up and right at an angle of 45 degrees from the inlet I.

A corner C3 of the connection unit area 95 nearest to the inlet I is placed so that the vicinity of the corner C3, a corner C14 placed on the same side of the connection unit area 92 as the other corner C13 nearest to the inlet I, and the inlet I are arranged on a straight line, and the vicinity of the corner C3, a corner C21 placed on the same side of the connection unit area 93 as the other corner C23 nearest to the inlet I, and the inlet I are arranged on a straight line. Meanwhile, the corner C1 placed on the same side of the connection unit area 95 as the corner C3 is placed so that the corner C1, the other corner C13 of the connection unit area 92 nearest to the inlet I, and the inlet I are arranged on a straight line.

Furthermore, a corner C4 placed on the same side of the connection unit area 95 as the corner C3 is placed so that the corner C4, the other corner C23 of the connection unit area 93 nearest to the inlet I, and the inlet I are arranged on a straight line.

Arranging the connection unit areas 92, 93, and 95 as described above reduces the uneven application of the color filter 47.

In other words, when the color filter 47 flows from the inlet I onto the sensor board 2 on which the connection unit areas 91 to 95 are arranged, the fluid pressures on the corners C11 and C14 placed on the same sides of the connection unit area 92 as the corner C13 nearest to the inlet I are lower than the fluid pressure on the corner C13. Similarly, the fluid pressures on the corners C21 and C24 placed on the same sides of the connection unit area 93 as the corner C23 nearest to the inlet I are lower than the fluid pressure on the corner C23. The difference among the fluid pressures causes uneven application of the color filter 47 on the pixel area 4 existing inside the connection unit areas 92 and 93 (on the opposite side to the inlet I).

However, the corner C1 on which a lower fluid pressure is put than the fluid pressure on the corner C3 of the connection unit area 95 nearest to the inlet I, the corner C13 of the connection unit area 92 nearest to the inlet I and on which a high fluid pressure is put, and the inlet I are arranged on a straight line in the sensor board 2 illustrated in FIG. 16. Furthermore, the vicinity of the corner C3 of the connection unit area 95 nearest to the inlet I and on which a high fluid pressure is put, the corner C14 on which a lower fluid pressure is put than the fluid pressure on the corner C13 of the connection unit area 92 nearest to the inlet I, and the inlet I are arranged on a straight line.

Furthermore, the corner C4 on which a lower fluid pressure is put than the fluid pressure on the corner C3 of the connection unit area 95 nearest to the inlet I, the corner C23 of the connection unit area 93 nearest to the inlet I and on which a high fluid pressure is put, and the inlet I are arranged on a straight line. Furthermore, the vicinity of the corner C3 of the connection unit area 95 nearest to the inlet I and on which a high fluid pressure is put, the corner C21 on which a lower fluid pressure is put than the fluid pressure on the corner C23 of the connection unit area 93 nearest to the inlet I, and the inlet I are arranged on a straight line.

Thus, the fluid pressure in the direction of the straight line with which the inlet I, the corner C1, and the corner C13 are connected; the fluid pressure in the direction of the straight line with which the inlet I, the vicinity of the corner C3, and the corner C14 are connected; the fluid pressure in the direction of the straight line with which the inlet I, the corner C4, and the corner C23 are connected; and the fluid pressure in the direction of the straight line with which the inlet I, the vicinity of the corner C3, and the corner C21 are connected are identical. As a result, the local difference among the fluid pressures of the color filter 47 is reduced, and thus the uneven application of the color filter 47 is reduced.

Note that the positional relationships between the inlet I and the corners C1 to C4, C13, C14, C21, and C23 can be controlled by the adjustment of the position and size of the connection unit areas 92, 93, and 95.

Figure 18:
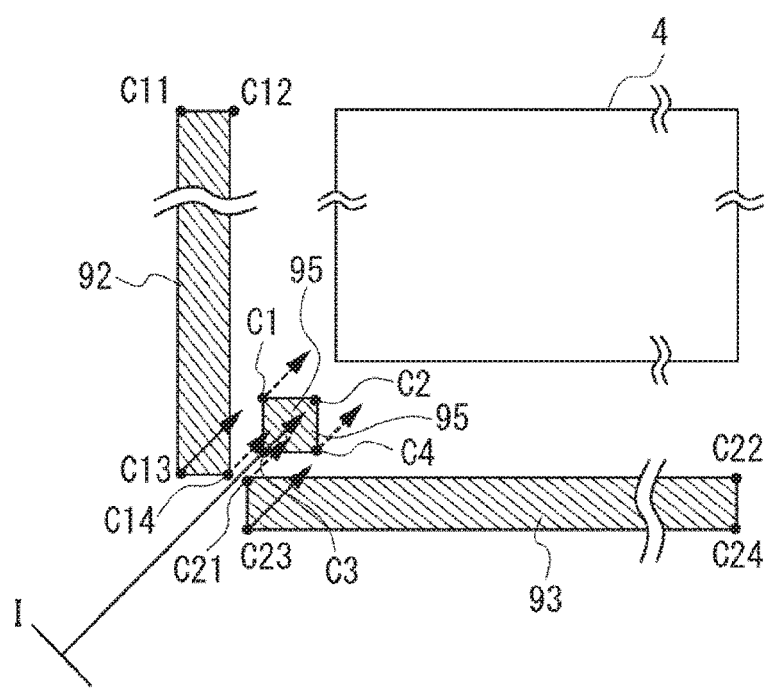
FIG. 18 is an explanatory diagram of another exemplary connection unit area.

In the example of FIG. 16, the connection unit area 95 is provided on the position nearer to the inlet I than the connection unit areas 91 to 94. However, the connection unit area 95 can be provided on a position farther from the inlet I than the connection unit areas 91 to 94 as illustrated in FIG. 18. In such a case, the positional relationships between the inlet I and the corners C1 to C4, C13, C14, C21, and C23 are similar to the positional relationships illustrated in FIG. 17. Thus, the uneven application of the color filter 47 is reduced.

In the example of FIG. 16, the difference among the fluid pressures on the corners C13, C14, C21, and C23 near the inlet I is reduced among the connection unit areas 91 to 94. However, the difference between the fluid pressure on the corner nearest to the inlet I and the fluid pressures on the two corners placed on the same sides as the nearest corner can be reduced in each of the connection unit areas.

Figure 19:
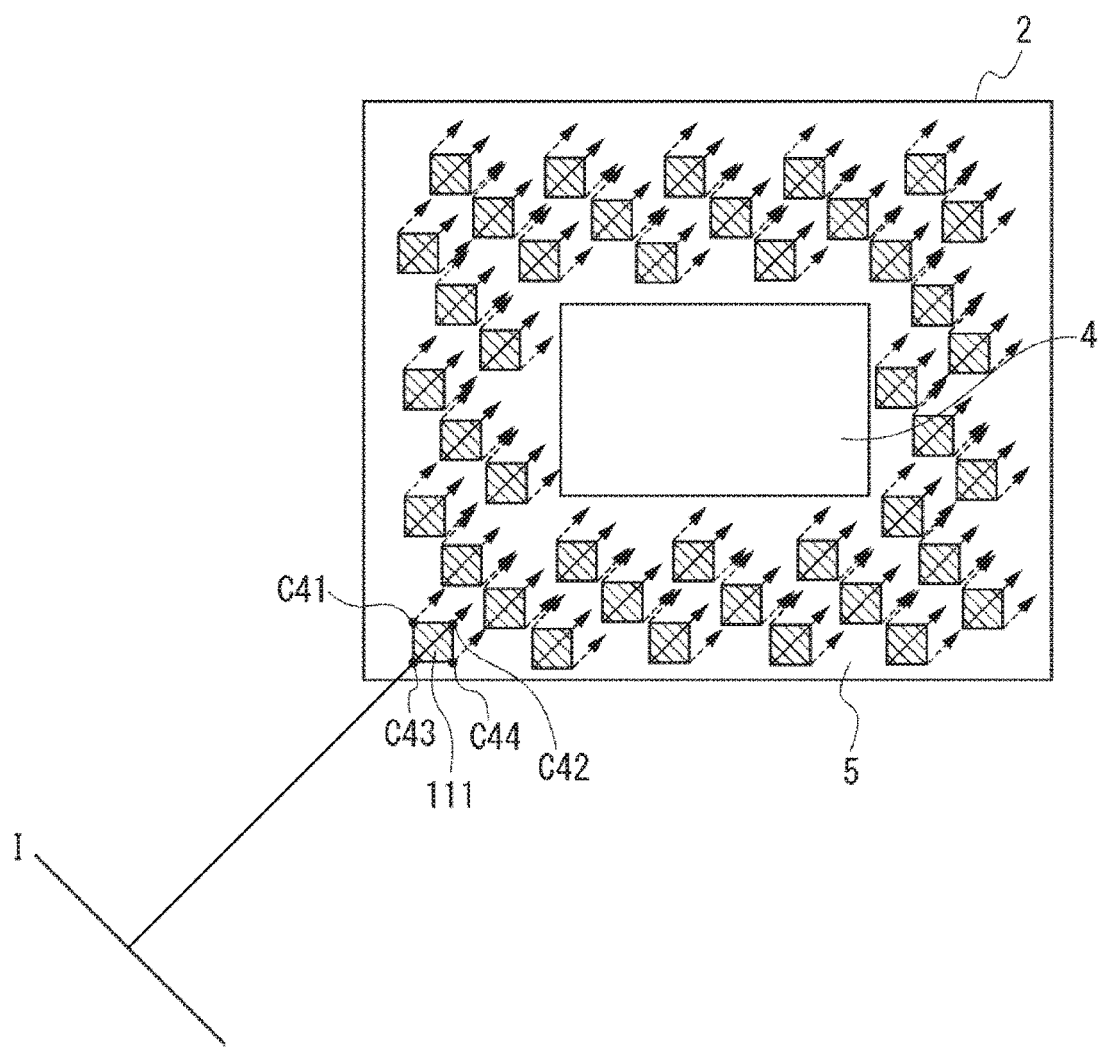
FIG. 19 is an explanatory diagram of another exemplary connection unit area.

In such a case, as illustrated in FIG. 19, each of connection unit areas 111 is placed so that the vicinity of the corner C43 nearest to the inlet I, the corner C41 or C44 placed on the same side of another connection unit area 111 as the corner C43 nearest to the inlet I, and the inlet I are arranged on a straight line. This placement makes the fluid pressures in the directions of all the straight lines, each of which connects the inlet I of each connection unit area 111, the corner C43 of the connection unit area 111, and the corner C41 or C44 of another connection unit area 111, identical. As the result, the uneven application of the color filter 47 is reduced.

In FIGS. 16 to 19, the color filter 47 flows up and right at an angle of 45 degrees to the horizontal. However, the direction in which the color filter 47 flows is not limited to the direction in FIGS. 16 to 19, and the color filter 47 can flow in an arbitrary direction.

(Another Exemplary Direction in which Color Filter Flows)

Figure 20:
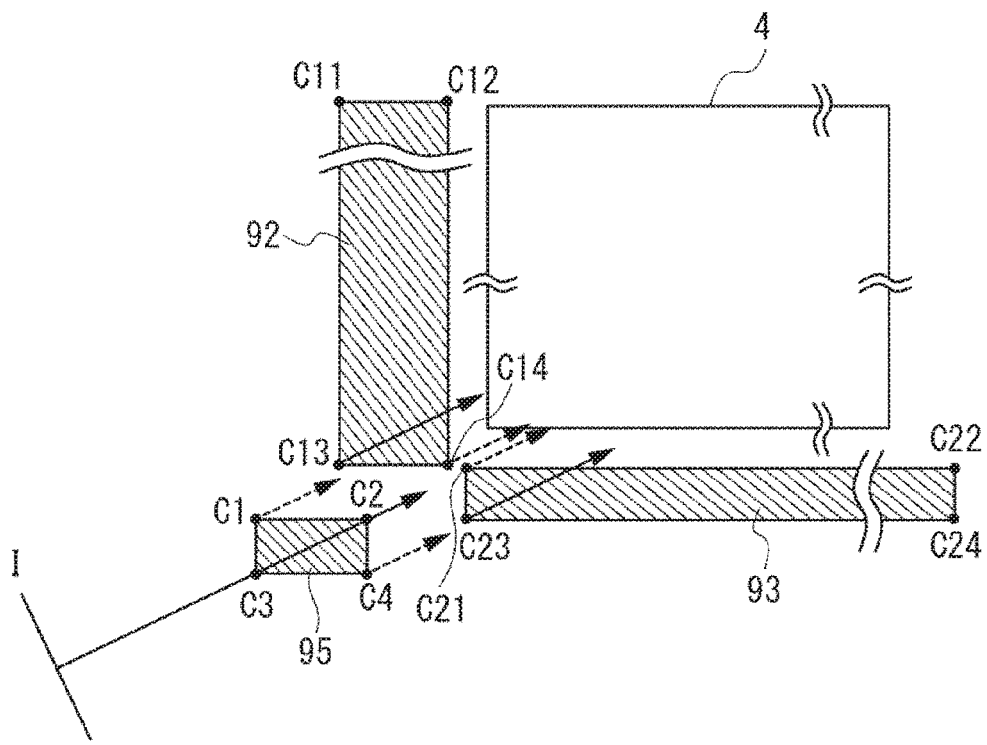
FIG. 20 is a diagram of an exemplary configuration of the sensor board into which a color filter flows up and right at an angle of 30 degrees to the horizontal.
Figure 21:
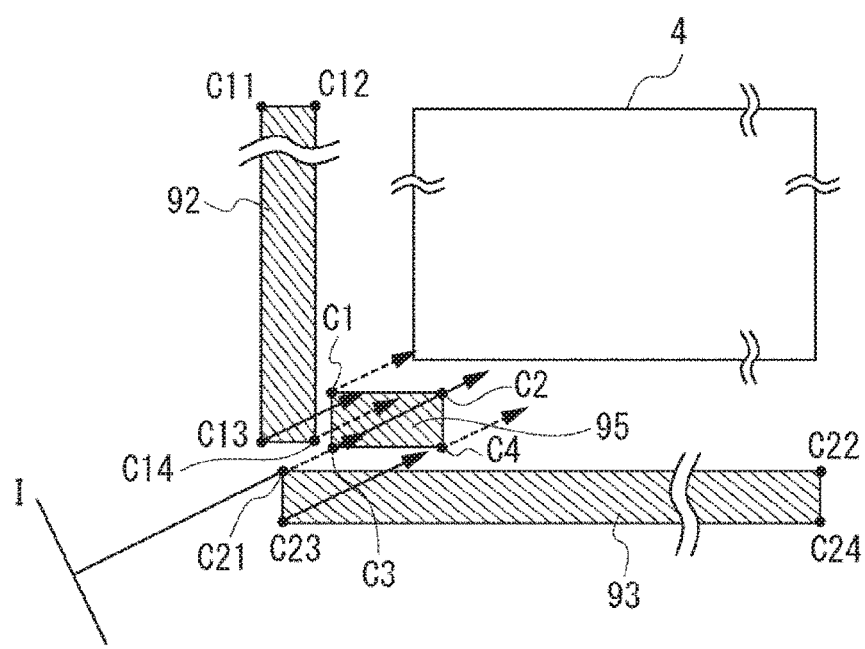
FIG. 21 is a diagram of another exemplary configuration of the sensor board into which a color filter flows up and right at an angle of 30 degrees to the horizontal.
Figure 22:
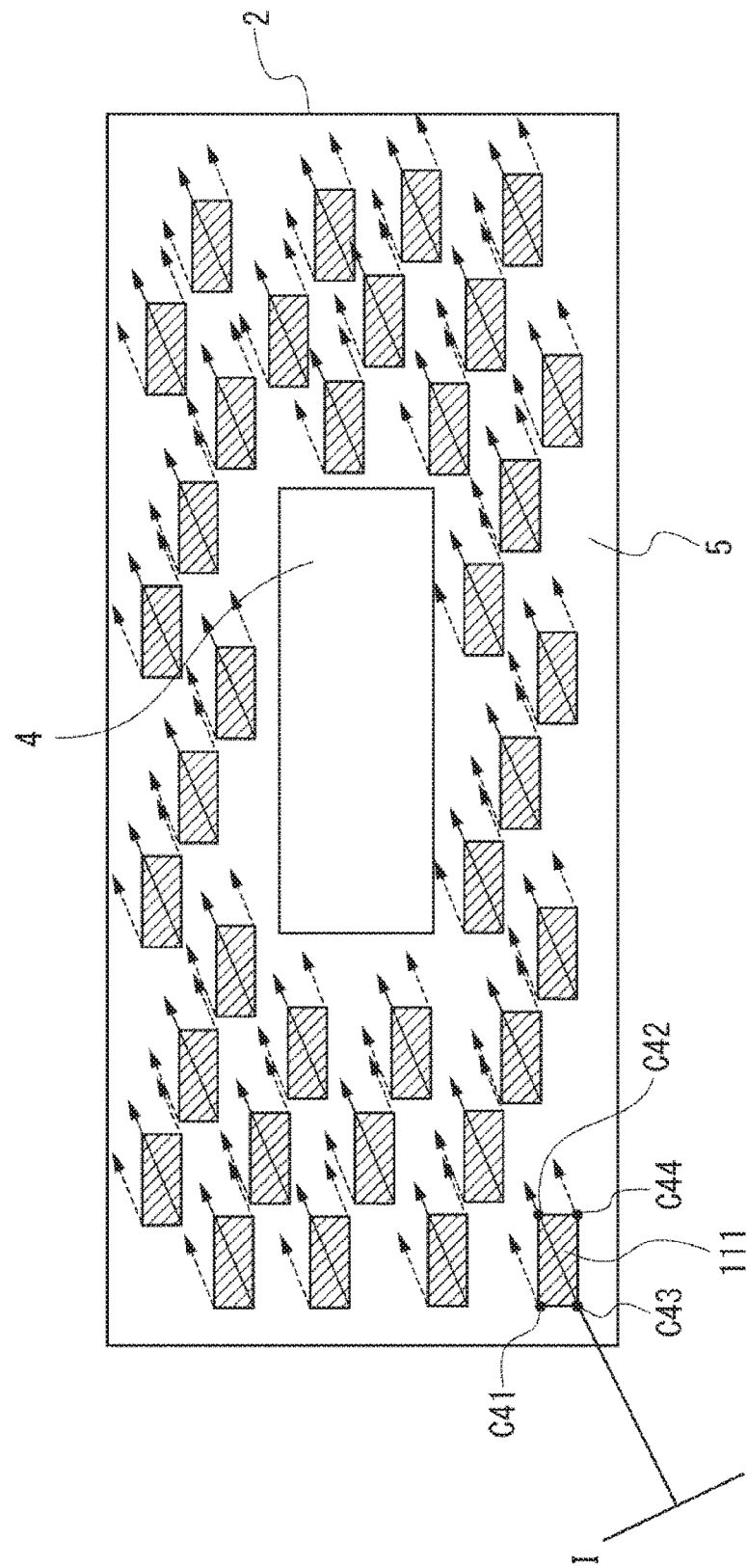
FIG. 22 is a diagram of another exemplary configuration of the sensor board into which a color filter flows up and right at an angle of 30 degrees to the horizontal.

FIGS. 20 to 22 are diagrams of exemplary configurations of the sensor board 2 when the color filter 47 flows up and right at an angle of 30 degrees to the horizontal.

Note that the same components in FIGS. 20 to 22 as the components in FIGS. 16 and 17 are put with the same reference signs. The description will properly be omitted in order to avoid repetition.

When the connection unit area 95 is provided on the position nearer to the inlet I than the connection unit areas 91 to 94 as illustrated in FIG. 16, the connection unit areas 92, 93, and 95 have a positional relationship as illustrated in FIG. 20.

Alternatively, when the connection unit area 95 is provided on the position farther from the inlet I than the connection unit areas 91 to 94 as illustrated in FIG. 18, the connection unit areas 92, 93, and 95 have a positional relationship as illustrated in FIG. 21.

To reduce the difference between the fluid pressure on the corner nearest to the inlet I and the fluid pressures on the two corners placed on the same sides of each connection unit area as the nearest corner as illustrated in FIG. 19, the connection unit areas 111 are provided on the sensor board 2 as illustrated in FIG. 22.

Providing the connection unit areas in consideration of the direction in which the color filter 47 flows as described above can reduce uneven application of the color filter 47 when the color filter 47 flows in any direction. As a result, when a plurality of sensor boards 2 is formed on a silicon wafer at various angles around the center of the silicon wafer and the color filter 47 flows from the center of the silicon wafer, uneven application of the color filter 47 can be reduced on each of the sensor boards 2.

Note that the color filter 47 can flows onto the sensor board 2 in a plurality of directions. In other words, the connection unit areas can be provided so that the difference among the fluid pressures on the corners is reduced and thus uneven application of the color filter 47 is reduced when the color filter 47 flows in any one of the directions.

(Exemplary Sensor Board into which Color Filter Flows in Plurality of Directions)

Figure 23:
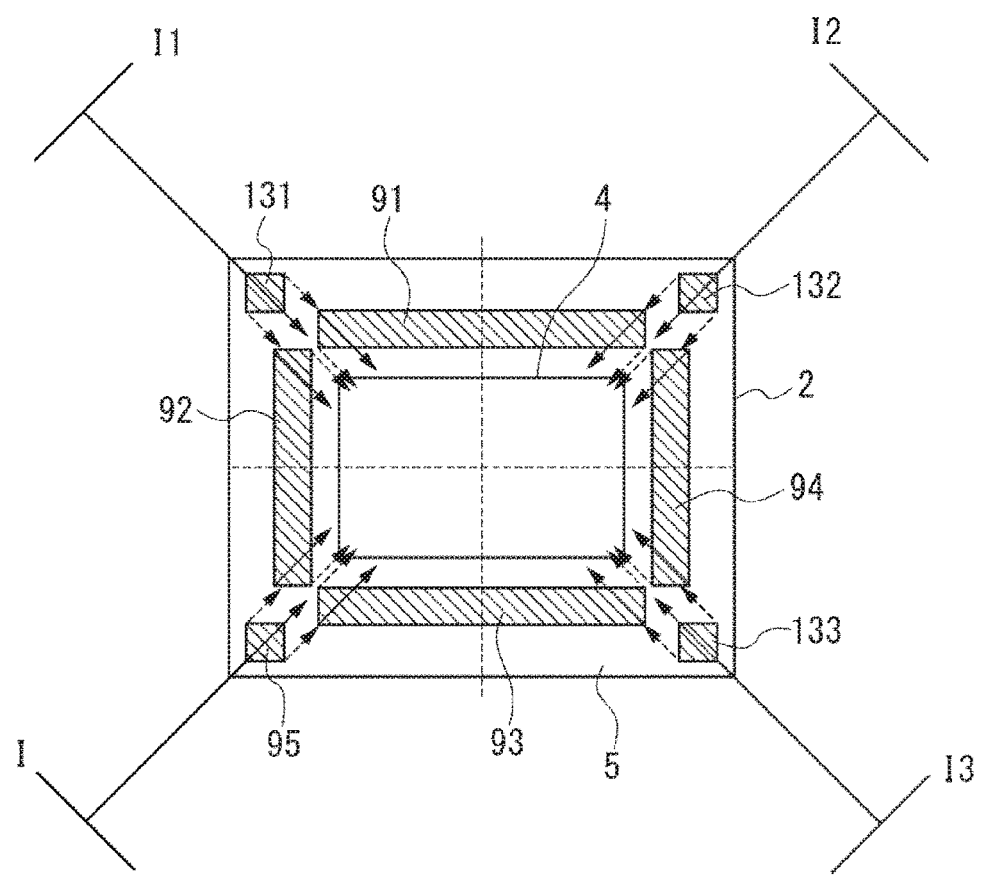
FIG. 23 is a diagram of another exemplary configuration of the sensor board into which a color filter flows up and right at an angle of 45 degrees, up and left at an angle of 135 degrees, down and left at an angle of 225 degrees, and down and right at an angle of 315 degrees to the horizontal.
Figure 24:
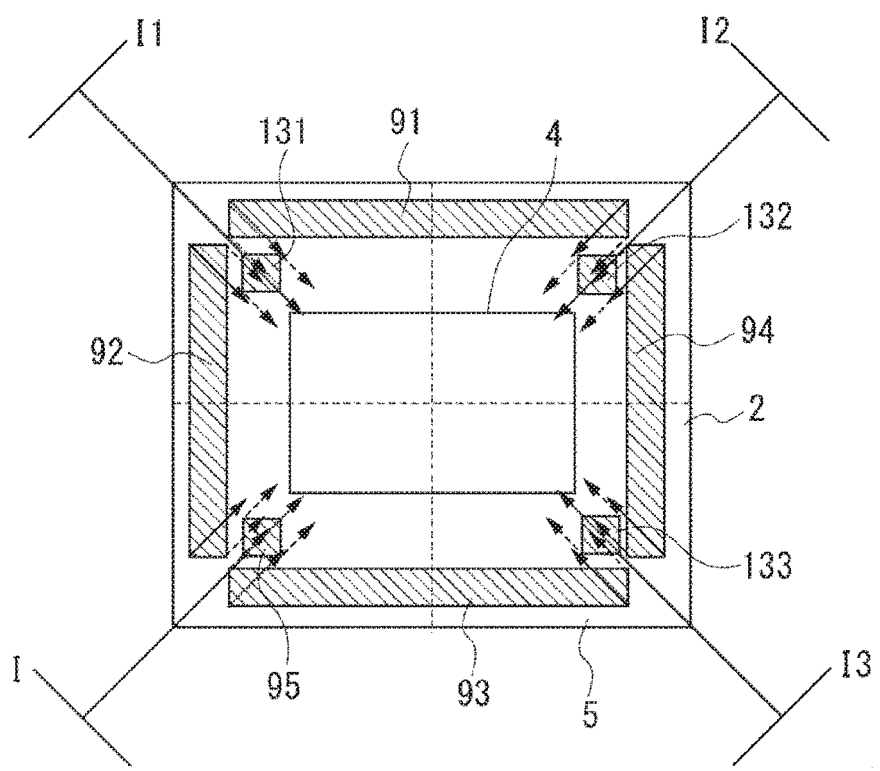
FIG. 24 is a diagram of another exemplary configuration of the sensor board into which a color filter flows up and right at an angle of 45 degrees, up and left at an angle of 135 degrees, down and left at an angle of 225 degrees, and down and right at an angle of 315 degrees to the horizontal.
Figure 25:
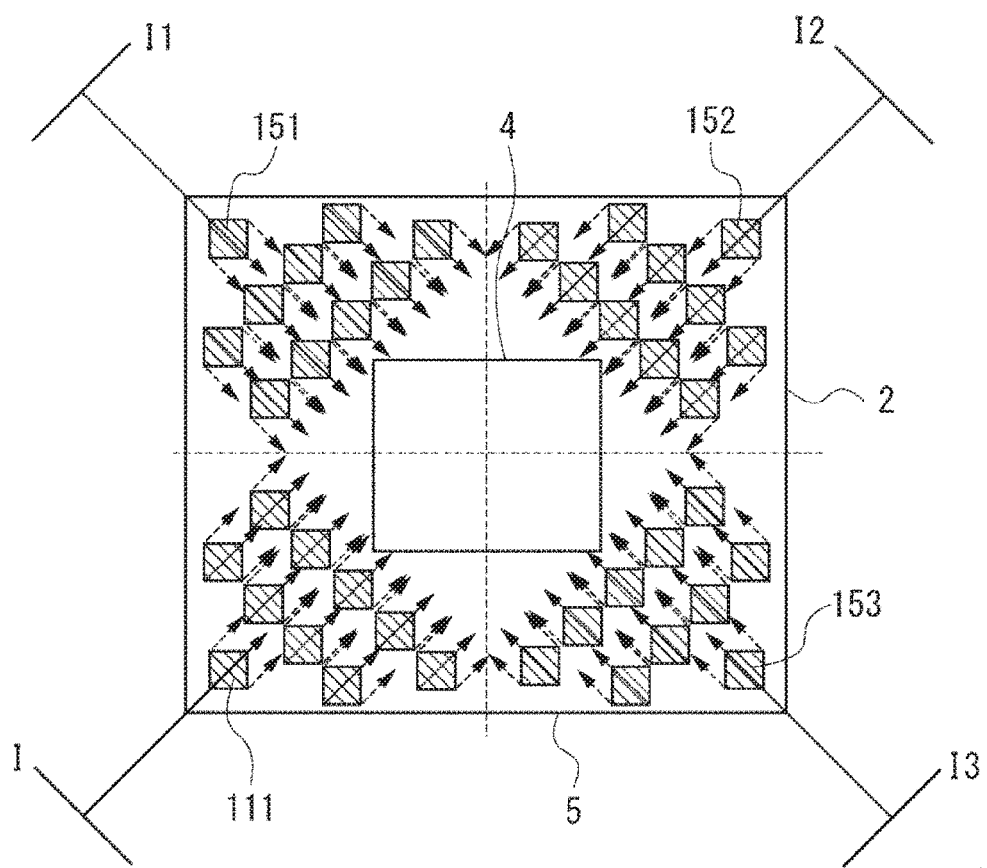
FIG. 25 is a diagram of another exemplary configuration of the sensor board into which a color filter flows up and right at an angle of 45 degrees, up and left at an angle of 135 degrees, down and left at an angle of 225 degrees, and down and right at an angle of 315 degrees to the horizontal.

FIGS. 23 to 25 are diagrams of exemplary configures of the sensor boards 2 into which the color filter 47 can flow up and right at an angle of 45 degrees, up and left at an angle of 135 degrees, down and left at an angle of 225 degrees, and down and right at an angle of 315 degrees to the horizontal.

Note that the same components in FIGS. 23 to 25 as the components in FIG. 16 are put with the same reference signs. The description will properly be omitted in order to avoid repetition.

When connection unit areas for reducing the fluid pressure are provided on the positions nearer to the inlets of the color filter 47 than the connection unit areas 91 to 94, respectively, as illustrated in FIG. 17, the connection unit areas are arranged as illustrated in FIG. 23.

In other words, as illustrated in FIG. 23, a connection unit area 95 is provided, similarly to in FIG. 17, so that the color filter 47 flows up and right at an angle of 45 degrees to the horizontal. Furthermore, a connection unit area 131 is provided for an inlet I1 from which the color filter 47 flows down and right at an angle of 315 degrees to the horizontal. Furthermore, a connection unit area 132 is provided for an inlet 12 from which the color filter 47 flows down and left at an angle of 225 degrees to the horizontal. Furthermore, a connection unit area 133 is provided for an inlet 13 from which the color filter 47 flows up and left at an angle of 135 degrees to the horizontal.

Note that the positional relationships between the inlet I1 and the corners of the connection unit areas 91, 92, and 131 are similar to the positional relationships between the inlet I and the corners of the connection unit areas 92, 93, and 95. Thus, the description will be omitted. The positional relationships between the inlet 12 and the corners of the connection unit areas 91, 94, and 132, and the positional relationships between the inlet 13 and the corners of the connection unit areas 93, 94, and 133 are also similar.

When connection unit areas for reducing the fluid pressure are provided on the positions farther from the inlets of the color filter 47 than the connection unit areas 91 to 94, respectively, similarly to FIG. 18, the connection unit areas 91 to 95, and 131 to 133 are arranged as illustrated in FIG. 24.

To reduce the difference between the fluid pressure on the corner nearest to the inlet and the fluid pressures on the two corners placed on the same sides of each connection unit area as the nearest corner for the inlet as illustrated in FIG. 19, the connection unit areas are arranged as illustrated in FIG. 25.

In other words, as illustrated in FIG. 25, a plurality of connection unit areas 111 is provided, similarly to in FIG. 19, so that the color filter 47 can flow up and right at an angle of 45 degrees to the horizontal. Furthermore, a plurality of connection unit areas 151 is provided for an inlet I1 from which the color filter 47 flows down and right at an angle of 315 degrees to the horizontal. Furthermore, a plurality of connection unit areas 152 is provided for an inlet 12 from which the color filter 47 flows down and left at an angle of 225 degrees to the horizontal. Furthermore, a plurality of connection unit areas 153 is provided for an inlet 13 from which the color filter 47 flows up and left at an angle of 135 degrees to the horizontal.

Note that the positional relationship between the inlet I1 and the corners of the connection unit area 151 is similar to the positional relationship between the inlet I and the corners of the connection unit area 111. Thus, the description will be omitted. The positional relationship between the inlet 12 and the corners of the connection unit area 152, and the positional relationship between the inlet 13 and the corners of the connection unit area 153 are also similar.

Figure 26:
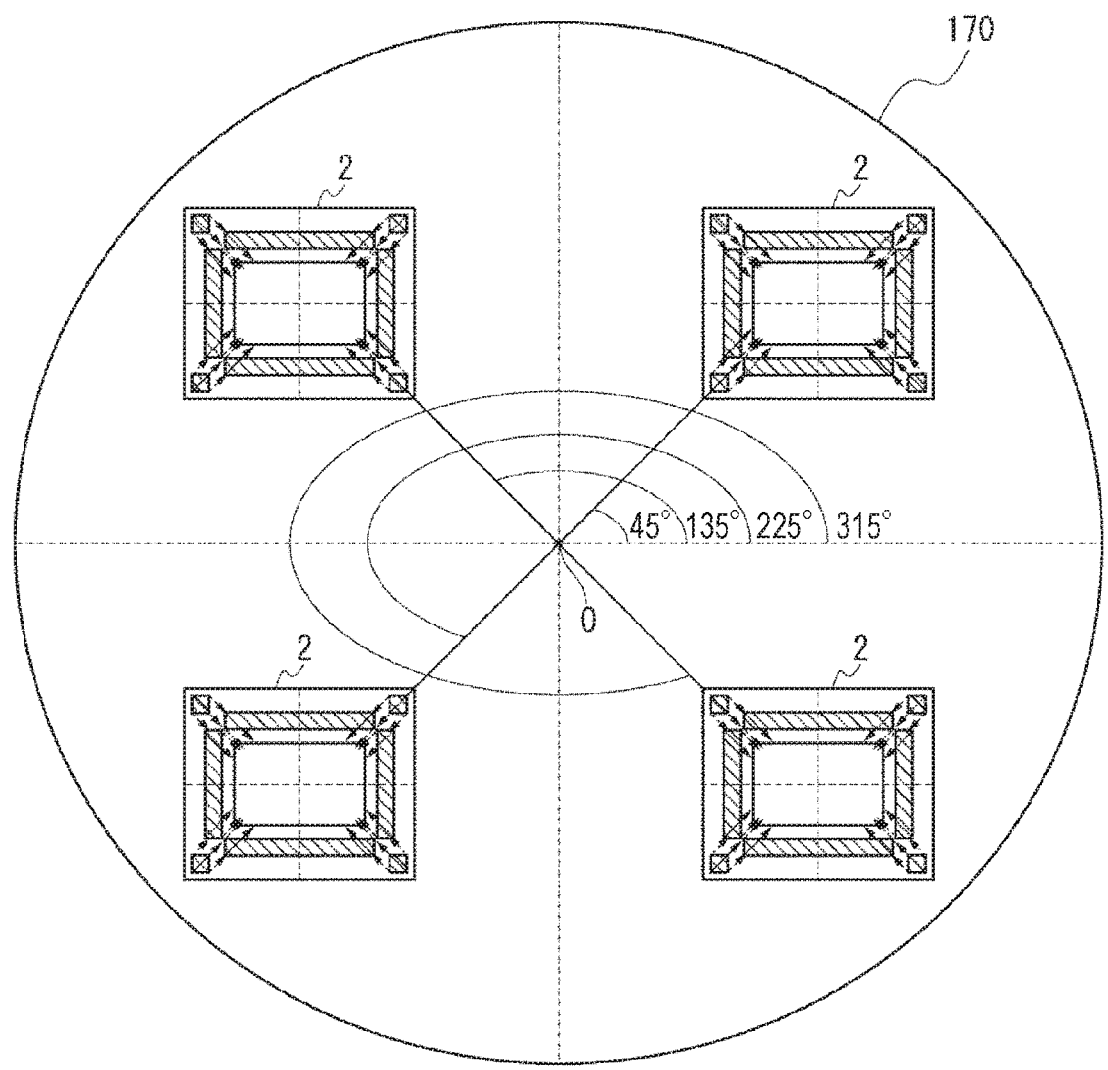
FIG. 26 is a diagram of exemplary sensor boards arranged under color filters.

As described above, the connection unit areas are arranged on the sensor board 2 illustrated in FIGS. 23 to 25 so that the color filter 47 can flow up and right at an angle of 45 degrees, up and left at an angle of 135 degrees, down and left at an angle of 225 degrees, and down and right at an angle of 315 degrees to the horizontal. Thus, as illustrated in FIG. 26, a type of sensor boards 2 among the types of sensor boards 2 illustrated in FIGS. 23 to 25 (the sensor boards 2 of FIG. 23 are arranged in the example of FIG. 26) can be formed at positions at angles of 45, 135, 225, and 315 degrees around a center O of a silicon wafer 170 into which the color filter 47 flows.

Note that, in the second embodiment, the connection unit areas are formed in order to reduce the difference of the fluid pressures. Instead of the connection unit areas, quadrangular-prism-shaped dummies can be formed on the sensor board 2.

<Third Embodiment>

(Exemplary Configuration of Sensor Board of Third Embodiment of CMOS Image Sensor)

The configuration of the third embodiment of the CMOS image sensor using the present disclosure is similar to the configuration of the CMOS image sensor 1 illustrated in FIG. 1 except for the sensor board 2. Thus, only the sensor board 2 will be described hereinafter.

Figure 27:
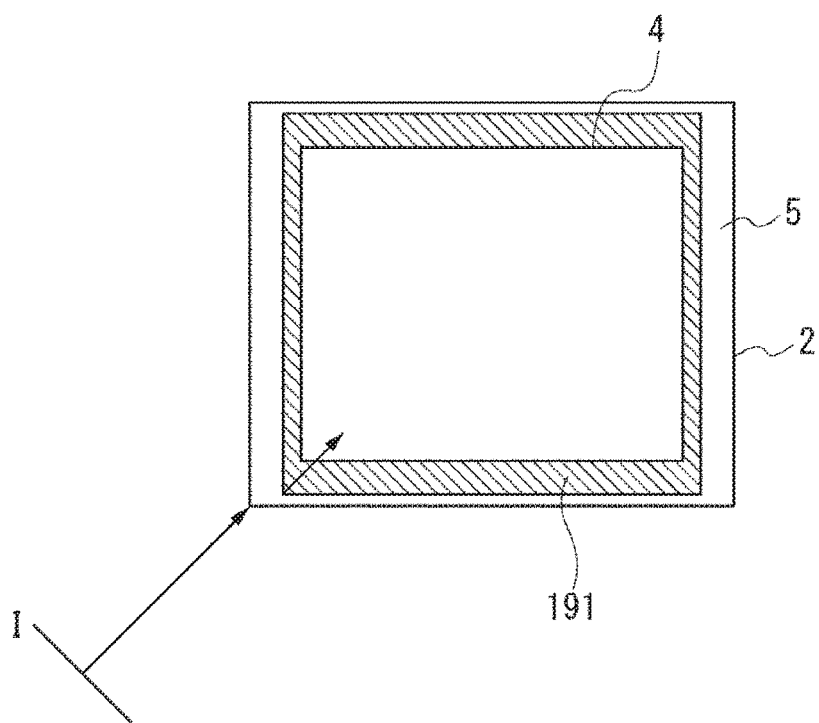
FIG. 27 is a diagram of an exemplary configuration of a sensor board of a third embodiment of a CMOS image sensor using the present disclosure.

FIG. 27 is a diagram of an exemplary configuration of the sensor board of the third embodiment of the CMOS image sensor using the present disclosure.

Among the components illustrated in FIG. 27, the same components as the components in FIG. 1 are put with the same reference signs. The overlapping description will properly be omitted.

Differently from the configuration in FIG. 1, a connection unit area 191 is provided instead of the connection unit areas 9 on a sensor board 2 illustrated in FIG. 27.

The connection unit area 191 is provided in a peripheral area 5 of the sensor board 2 in FIG. 27 so that the connection unit area 19 surrounds the sides of a pixel area 4. In other words, the connection unit area 191 is formed into a ring-shaped solid on the sensor board 2 so as to surround the pixel area 4.

(Exemplary Configuration of Connection Unit Area)

Figure 28:
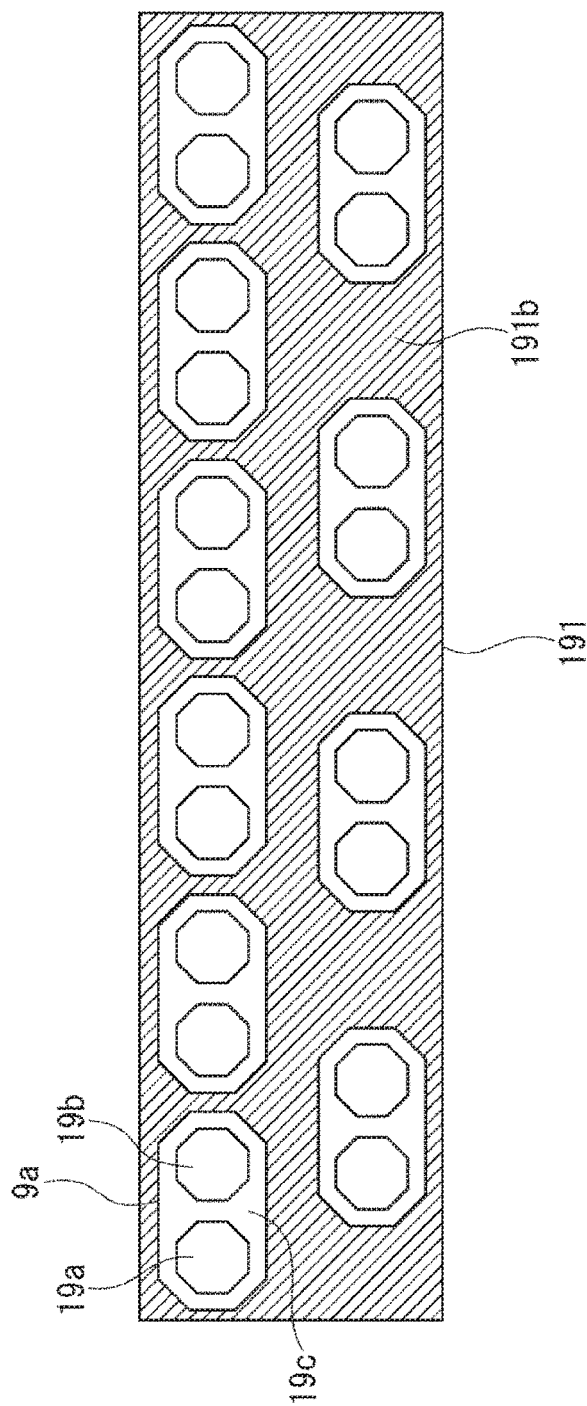
FIG. 28 is a diagram of an exemplary configuration of the connection unit area illustrated in FIG. 27.

FIG. 28 is a diagram of an exemplary configuration of the connection unit area 191 illustrated in FIG. 27.

In the connection unit area 191 of FIG. 28, connection units 9a are arranged so that the longitudinal sides of the connection units 9a are arranged in a direction, and a peripheral unit 191b is formed around the connection units 9a. Even when the connection units 9a are arranged at wide intervals, the connection units 9a are not divided into different connection unit areas and connected to each other by the peripheral unit 191b in the connection unit area 191. In other words, the peripheral unit 191b extends regardless of the arrangement of the connection units 9a so as to form a connection unit area 191 on the sensor board 2 in FIG. 27.

This formation reduces the number of corners of the connection unit areas on the sensor board 2 near the inlet I, and thus reduces the uneven application of the color filter 47 caused by the difference among the fluid pressures on the corners.

Figure 29:
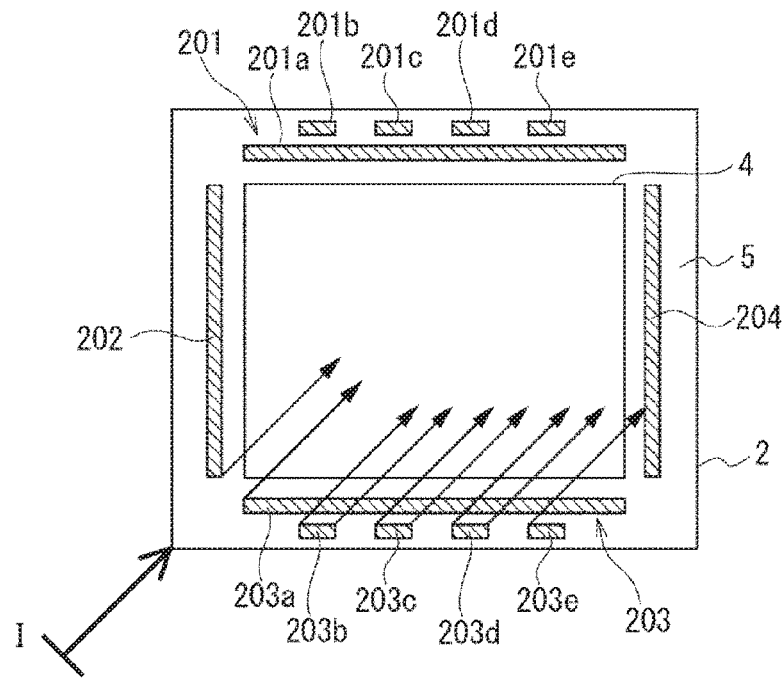
FIG. 29 is a diagram of an exemplary configuration of a sensor board when there are many corners facing the inlet in the connection unit area.

On the other hand, as illustrated in FIG. 29, the number of corners facing the inlet I increases when the connection unit area 191 is divided into four connection unit areas 201 to 204 corresponding to the sides of the pixel area 4, respectively; and each of the connection unit areas 201 and 203 divided corresponding to the horizontal sides of the pixel area 4 is further divided into two so that each of the further divided connection unit areas includes a horizontal line of the connection units 9a; and the connection units 9a, which are arranged at wider intervals among the connection units 9a included in the horizontal lines, are further divided into connection unit areas.

In other words, when the connection unit areas 201a to 201e, 202, 203a to 203e, and 204 are provided instead of the connection unit area 191, the number of corners near the inlet I increases. This increases uneven application of the color filter 47 caused by the difference among the fluid pressures of the corners.

Figure 30:
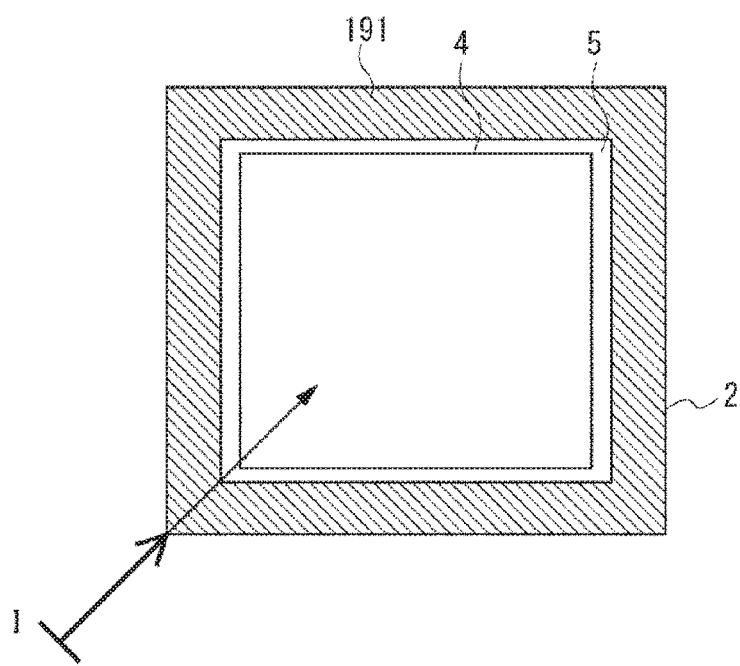
FIG. 30 is a diagram of another exemplary connection unit area.
Figure 31:
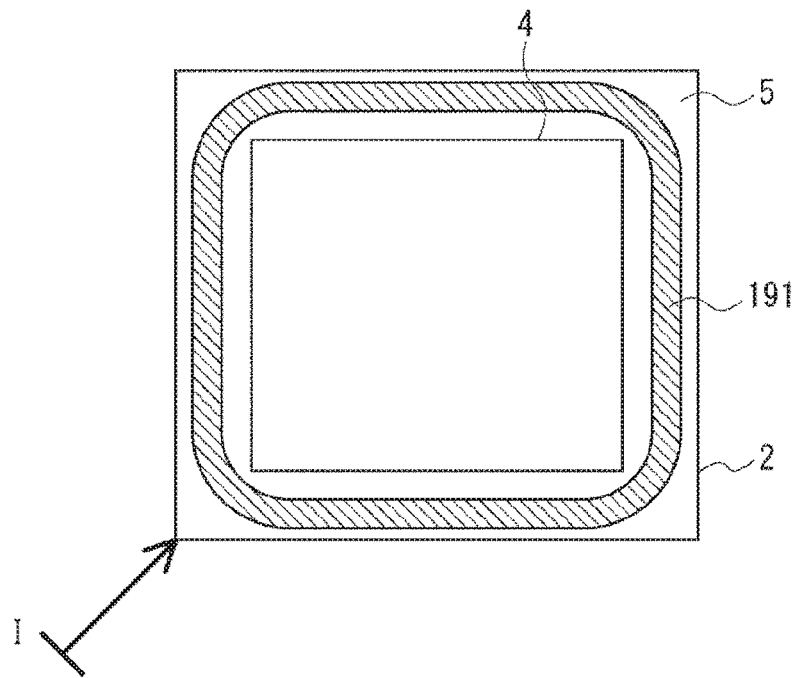
FIG. 31 is a diagram of another exemplary connection unit area.

The shape and position of the connection unit area 191 are not limited to those in FIG. 27. For example, as illustrated in FIG. 30, the connection unit area 191 can be configured to cover the outside of the sides of the pixel area 4. Alternatively, as illustrated in FIG. 31, the connection unit area 191 can be formed into a circular ring-shaped solid on the sensor board 2.

Figure 32:
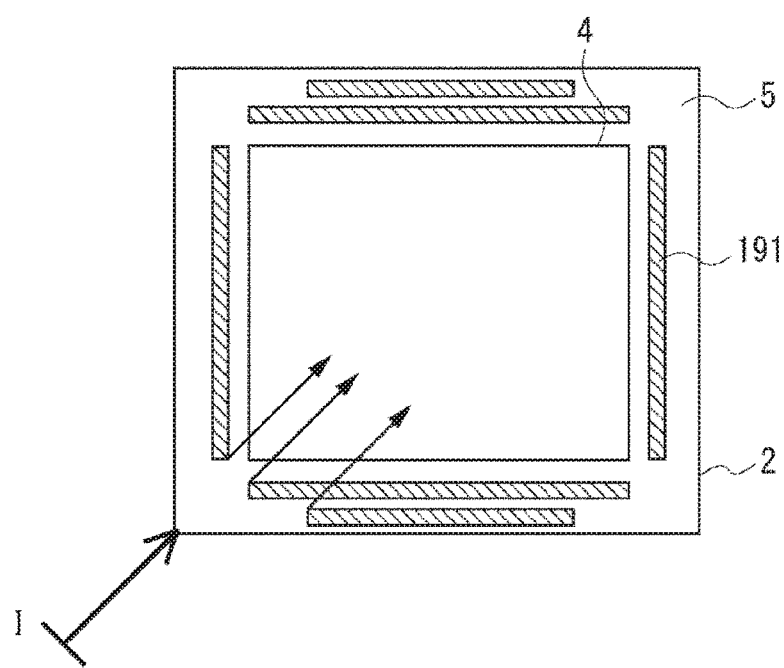
FIG. 32 is a diagram of another exemplary connection unit area.
Figure 33:
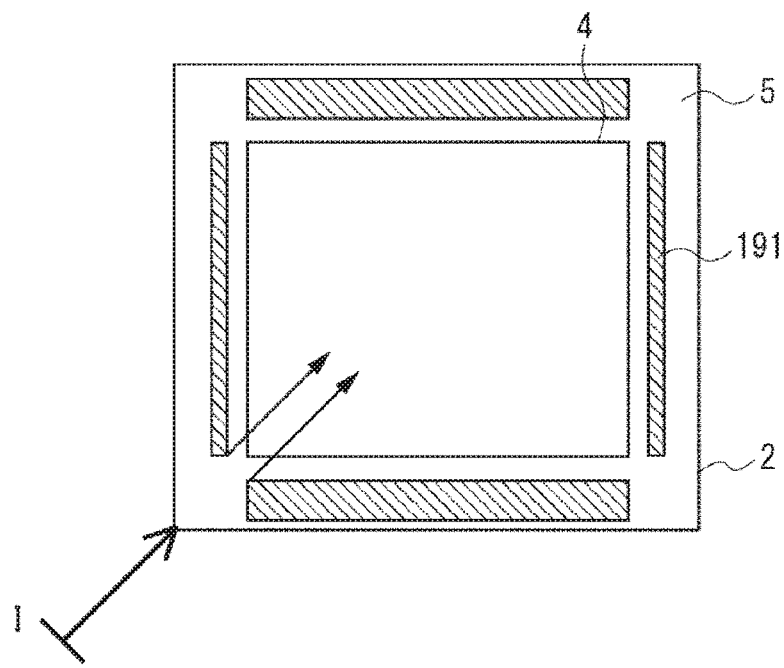
FIG. 33 is a diagram of another exemplary connection unit area.

Alternatively, as illustrated in FIG. 32, the connection unit areas 191 can be arranged on the sides of the pixel area 4, respectively, and each of the connection unit areas 191 arranged on the horizontal sides of the pixel area 4 can be divided into two in a vertical direction. Alternatively, as illustrated in FIG. 33, the connection unit areas 191 can be arranged on the sides of the pixel area 4, respectively.

<Fourth Embodiment>

(Exemplary Configuration of One Embodiment of CCD Image Sensor)

Figure 34:
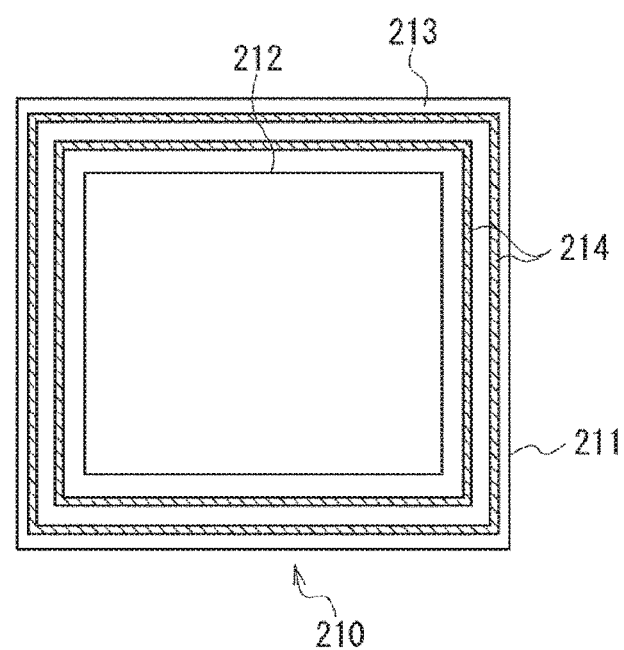
FIG. 34 is a schematic diagram of an exemplary configuration of an embodiment of a CCD image sensor to be described as a solid-state image device using the present disclosure.

FIG. 34 is a diagram of an exemplary configuration of an embodiment of a CCD image sensor that is a solid-state image device using the present disclosure.

As illustrated in FIG. 34, a CCD image sensor 210 is formed by a semiconductor substrate 211. The semiconductor substrate 211 includes a central pixel area 212 and a peripheral area 213 placed outside the pixel area 212. The pixel area 212 is an area in which pixels, each of which has an opto-electronic converter, are two-dimensionally arranged. Similarly to the CMOS image sensor 1, a color filter is formed on the semiconductor substrate 211 of each pixel.

In the peripheral area 213, two wiring units 214 including different wires, respectively, are formed into a ring-shaped solid as a height difference portion on the semiconductor substrate 211 so that the two wiring units 214 surround the sides of the pixel area 212. The wiring units 214 are arranged at a predetermined interval d2 so that the wiring units 214 are separate the interval d2 away from each other. The interval d2 is longer than or equal to the length of the wiring unit 214 in a direction in which the wiring units 214 are arranged at the interval d2.

(Description of Uneven Application of Color Filter Caused by Wiring Unit)

Figure 35:
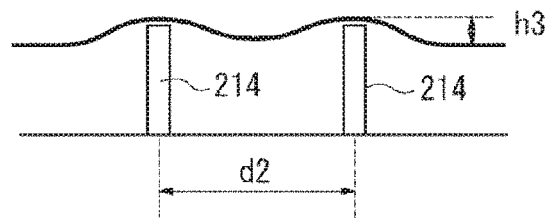
FIG. 35 is an explanatory diagram of uneven application of a color filter caused by the wiring unit.

FIG. 35 is an explanatory diagram of uneven application of a color filter caused by the wiring units 214.

In the CCD image sensor 210, the wiring units 214 are arranged at the interval d2, and thus the areas of the upper parts of the wiring units 214 are relatively small. Thus, as illustrated in FIG. 35, when a height difference h3 of the color filter flowing from the outside of the wiring unit 214 is caused by the wiring unit 214, the height difference h3 is relatively small.

Figure 36:
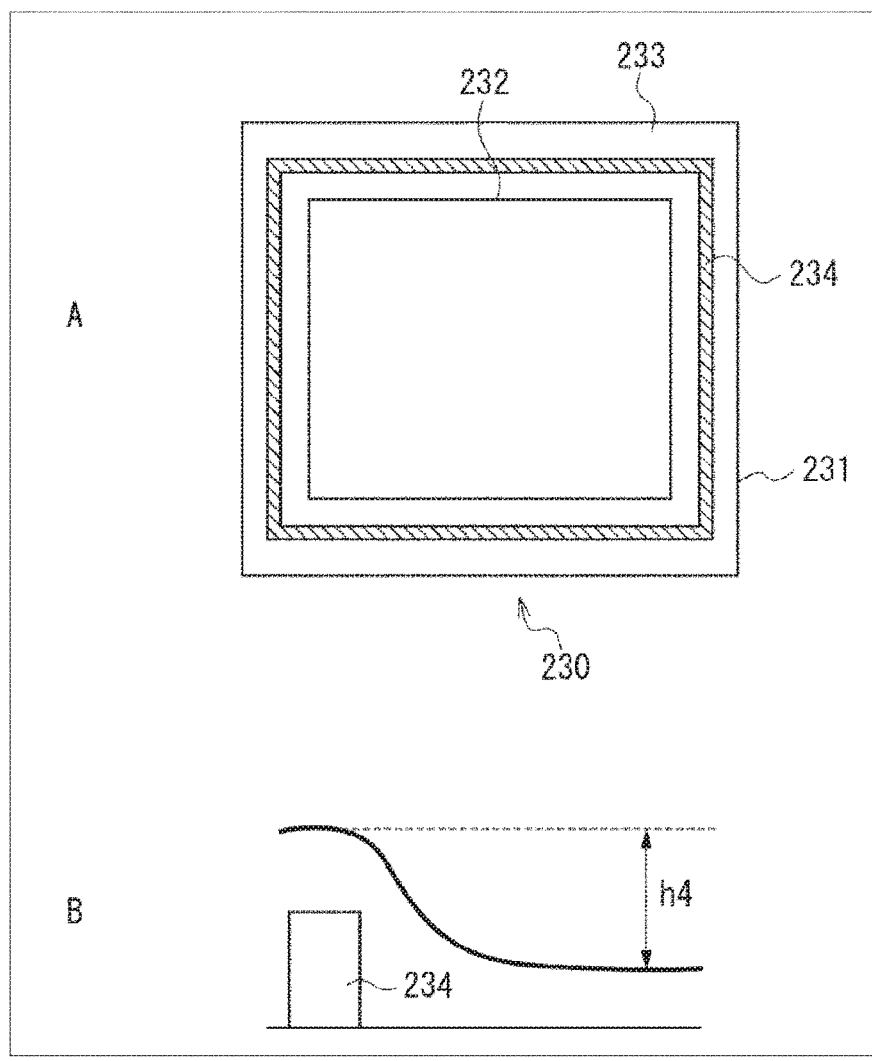
FIG. 36 is an explanatory diagram of a sensor board on which the wiring units are arranged at intervals of zero.
Figure 37:
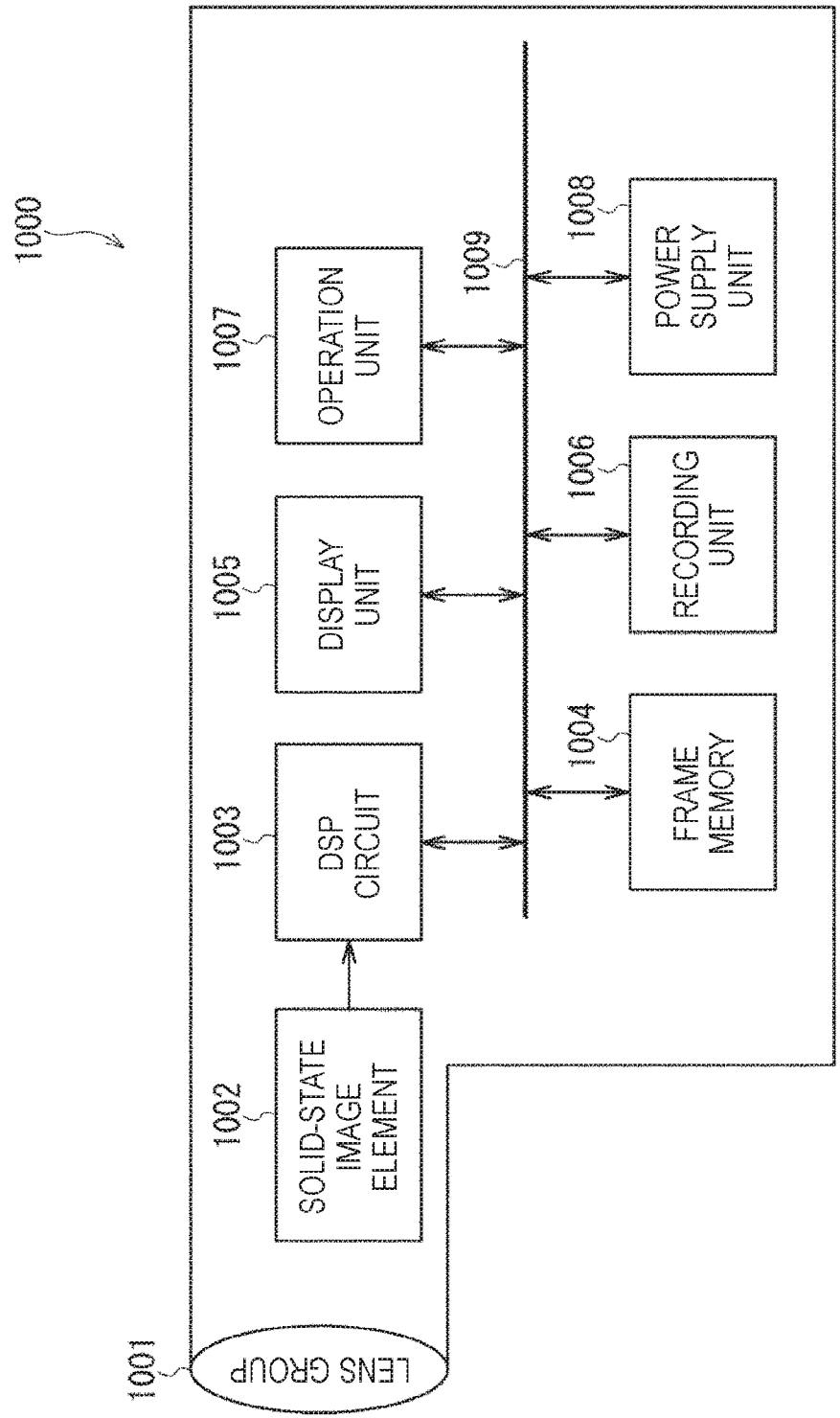
FIG. 37 is a block diagram of an exemplary configuration of an imaging device to be described as an electronic device using the present disclosure.

On the other hand, in a semiconductor substrate 230 as illustrated in A of FIG. 36, the wiring units 214 are arranged at an interval zero shorter than the interval d2, and thus a wiring unit 234 is formed in a peripheral area 233 on a semiconductor substrate 231 so that the wiring unit 234 surrounds the pixel area 232. Thus, the area of the upper part of the wiring unit 234 is relatively large. Thus, as illustrated in B of FIG. 36, when a height difference h4 of a color filter flowing from the outside of the wiring unit 234 is caused by the wiring unit 234, the height difference h4 is larger than the height difference h3.

As described above, the wiring units 214 are arranged at the interval d2 in the CCD image sensor 210, and thus the height difference h3 of the color filter caused by the wiring unit 214 is smaller than the height difference h4. This can reduce uneven application of the color filter.

Note that the resistance is determined depending on the volume of the wiring unit (metal). The volume of the two wiring units 214 is identical to the volume of the wiring unit 234 whereas the interval between the two wiring units 214 is different from the interval in the wiring unit 234. Thus, even when the two wiring units 234 are formed instead of the wiring unit 214, the formation does not cause propagation delay.

<Fifth Embodiment>

(Exemplary Configuration of One Embodiment of Electronic Device)

FIG. 37 is a block diagram of an exemplary configuration of an imaging device to be described as an electronic device using the present disclosure.

An imaging device 1000 illustrated in FIG. 37 is, for example, a video camera or a digital still camera. The imaging device 1000 includes a lens group 1001, a solid-state image element 1002, a DSP circuit 1003, a frame memory 1004, a display unit 1005, a recording unit 1006, an operation unit 1007, and a power supply unit 1008. The DSP circuit 1003, the frame memory 1004, the display unit 1005, the recording unit 1006, the operation unit 1007, and the power supply unit 1008 are connected to one another by a bus line 1009.

The lens group 1001 captures the incident light (image light) from an object, and forms the image on the imaging surface of the solid-state image element 1002. The solid-state image element 1002 includes the CMOS image sensor 1 or the CCD image sensor 210. The solid-state image element 1002 converts the light intensity of the incident light from which the lens group 1001 forms the image on the imaging surface into electric signals pixel by pixel, and then provides the electric signals as the pixel signals to the DSP circuit 1003.

The DSP circuit 1003 processes the pixel signals provided from the solid-state image element 1002 in a predetermined image processing method. Then, the DSP circuit 1003 provides and temporarily stores the image signals processed in the image processing method frame by frame in the frame memory 1004.

The display unit 1005 includes a panel display device including, for example, a liquid crystal panel or an organic Electro Luminescence (EL) panel so as to display images in accordance with the pixel signals frame by frame temporarily stored in the frame memory 1004.

The recording unit 1006 includes, for example, a Digital Versatile Disk (DVD) or a flash memory so as to read and record the pixel signals by the frame temporarily stored in the frame memory 1004.

The operation unit 1007 issues the operation instructions about the various functions that the imaging device 1000 has under the user's operation. The power supply unit 1008 appropriately supplies the power to the DSP circuit 1003, the frame memory 1004, the display unit 1005, the recording unit 1006, and the operation unit 1007.

The electronic device using the present technology only needs being an electronic device using a solid-state image device in the image capturing unit (opto-electronic converter). Not only the imaging device 1000 but also, for example, a mobile terminal device with an imaging function, or a copy machine using a solid-state image device in the image reading unit can be the electronic device using the present disclosure.

The effects described herein are merely examples. The effects of the present disclosure are not limited to the described effects, and can include another effect.

Furthermore, the embodiments of the present disclosure are not limited to the embodiments described above, and can variously be changed without departing from the gist of the present disclosure.

For example, although the side surface of the peripheral unit 9b is formed in a tapered shape in the description, the film thickness of the peripheral unit 9b does not need changing or can be thinned in stages. When the side surface of the peripheral unit 9b has a tapered shape, the color filter 47 flows more smoothly. This can further reduce uneven application of the color filter 47.

The present disclosure can be applied also to a front-side illumination CMOS image sensor with a layer structure.

When the configuration of the connection unit areas of the second and third embodiments is applied to the wiring units in a CCD image sensor, uneven application of the color filter can be reduced.

The configuration of the connection units of the first to third embodiments can be a shared contact structure. An example of the shared contact structure is described in Japanese Patent Application Laid-Open No. 2013-80813.

The present disclosure can have the following configuration.

(1)

A solid-state image device including:

a color filter formed on a first substrate; and a plurality of first height difference portions formed on the first substrate, wherein at least one of the first height difference portions is placed a first interval away from the other first height difference portions.

(2)

The solid-state image device according to (1), wherein the first interval is longer than or equal to a length of the first height difference portion in a direction in which the first height difference portions is placed the first interval away from the other first height difference portions.

(3)

The solid-state image device according to (1) or (2), wherein the first height difference portions are configured to electrically connect the first substrate and a second substrate.

(4)

The solid-state image device according to (3), wherein each of the first height difference portions is arranged the first intervals away from the other first height difference portions.

(5)

The solid-state image device according to (4), further including:

a second height difference portion formed on the first substrate, wherein the second height difference portion is placed a second interval away from the first height difference portions in a direction perpendicular to the direction in which the first height difference portions are arranged, the second interval being shorter than the first interval.

(6)

A method for manufacturing a solid-state image device including:

manufacturing a solid-state image device, the solid-state image device including:

a color filter formed on a first substrate; and a plurality of first height difference portions formed on the first substrate, wherein at least one of the first height difference portions is placed a first interval away from the other first height difference portions.

(7)

An electronic device including:

a color filter formed on a first substrate; and a plurality of first height difference portions formed on the first substrate, wherein at least one of the first height difference portions is placed a first interval away from the other first height difference portions.

(8)

A solid-state image device including:

a color filter formed on a first substrate; and a plurality of first height difference portions formed into a quadrangular prism on the first substrate, wherein a predetermined first height difference portion of the first height difference portions is placed so that a first corner nearest to a first position among corners of the predetermined height difference portion, a second corner placed on a first side of a second first height difference portion on which a third corner nearest to the first position is also placed, and the first position are arranged in a straight line, and a fourth corner placed on a second side on which the first corner nearest to the first position among the corners of the predetermined height difference portion is also placed, the third corner of the second first height difference portion nearest to the first position, and the first position are arranged in a straight line.

(9)

The solid-state image device according to (8), wherein the first height difference portions are configured to connect the first substrate and a second substrate.

(10)

The solid-state image device according to (8) or (9), wherein each of the first height difference portions is placed so that a corner nearest to the first position among corners of each of the first height difference portions, and a corner placed on a side on which a corner of another first height difference portion nearest to the first position is also placed, and the first position are arranged in a straight line, and a corner placed on a side on which the corner nearest to the first position among the corners of each of the first height difference portions is also placed, and the corner of another first height difference portion nearest to the first position, and the first position are arranged in a straight line.

(11)

The solid-state image device according to any of (8) to (10), further including:

a plurality of second height difference portions formed into a quadrangular prism on the first substrate, wherein a predetermined second height difference portion of the second height difference portions is placed so that a fifth corner nearest to a second position among corners of the predetermined second height difference portion, a sixth corner placed on a third side of a second height difference portion on which a seventh corner nearest to the second position is also placed, and the second position are arranged in a straight line, and an eighth corner placed on a fourth side on which the fifth corner nearest to the second position among the corners of the predetermined second height difference portion is also placed, the seventh corner of the second height difference portion nearest to the second position, and the second position are arranged in a straight line.

(12)

The solid-state image device according to (11), wherein each of the second height difference portions is placed so that a corner nearest to the second position among corners of each of the second height difference portions, and a corner placed on a side on which a corner of another second height difference portion nearest to the second position is also placed, and the second position are arranged in a straight line, and a corner placed on a side on which the corner nearest to the second position among the corners of each of the second height difference portions is also placed, and the corner of another second height difference portion nearest to the second position, and the second position are arranged in a straight line.

(13)

A solid-state image device including:

a color filter formed on a first substrate; and a height difference portion formed into a ring-shaped solid on the first substrate so that the height difference portion surrounds the color filter.

(14)

The solid-state image device according to (13), wherein the height difference portion is configured to electrically connect the first substrate and a second substrate.

REFERENCE SIGNS LIST

1 CMOS image sensor
2 Sensor board
3 Circuit board
9 Connection unit area
47 Color filter
91 to 95, 111, 191 Connection unit area
210 CCD image sensor
214 Wiring unit
1000 Imaging device

What is claimed is:

1. A solid-state image device comprising:
a color filter formed on a first substrate; and
a plurality of first height difference portions formed on the first substrate,
wherein at least a first one of the first height difference portions is placed a first interval away from the other first height difference portions, wherein the first interval is longer than or equal to a length of the first one of the first height difference portions in a direction in which the first one of the first height difference portions is placed the first interval away from the other first height difference portions.

2. A solid-state image device comprising:
a color filter formed on a first substrate; and
a plurality of first height difference portions formed on the first substrate,
wherein at least a first one of the first height difference portions is placed a first interval away from the other first height difference portions, wherein the first height difference portions are configured to electrically connect the first substrate and a second substrate.

3. The solid-state image device according to claim 2, wherein each of the first height difference portions is arranged the first interval away from the nearest other first height difference portions.

4. The solid-state image device according to claim 3, further comprising:
a second height difference portion formed on the first substrate,
wherein the second height difference portion is placed a second interval away from the first height difference portions in a direction perpendicular to the direction in which the first height difference portions are arranged, the second interval being shorter than the first interval.

5. A solid-state image device comprising:
a color filter formed on a first substrate; and
a plurality of first height difference portions formed into a quadrangular prism on the first substrate,
wherein a predetermined first height difference portion of the first height difference portions is placed so that a first corner nearest to a first position among corners of the predetermined height difference portion, a second corner placed on a first side of a second first height difference portion on which a third corner nearest to the first position is also placed, and the first position are arranged in a straight line, and a fourth corner placed on a second side on which the first corner nearest to the first position among the corners of the predetermined height difference portion is also placed, the third corner of the second first height difference portion nearest to the first position, and the first position are arranged in a straight line.

6. The solid-state image device according to claim 5, wherein the first height difference portions are configured to connect the first substrate and a second substrate.

7. The solid-state image device according to claim 5, wherein each of the first height difference portions is placed so that a corner nearest to the first position among corners of each of the first height difference portions, and a corner placed on a side on which a corner of another first height difference portion nearest to the first position is also placed, and the first position are arranged in a straight line, and a corner placed on a side on which the corner nearest to the first position among the corners of each of the first height difference portions is also placed, and the corner of another first height difference portion nearest to the first position, and the first position are arranged in a straight line.

8. The solid-state image device according to claim 5, further comprising:
a plurality of second height difference portions formed into a quadrangular prism on the first substrate,
wherein a predetermined second height difference portion of the second height difference portions is placed so that a fifth corner nearest to a second position among corners of the predetermined second height difference portion, a sixth corner placed on a third side of a second height difference portion on which a seventh corner nearest to the second position is also placed, and the second position are arranged in a straight line, and an eighth corner placed on a fourth side on which the fifth corner nearest to the second position among the corners of the predetermined second height difference portion is also placed, the seventh corner of the second height difference portion nearest to the second position, and the second position are arranged in a straight line.

9. The solid-state image device according to claim 8, wherein each of the second height difference portions is placed so that a corner nearest to the second position among corners of each of the second height difference portions, and a corner placed on a side on which a corner of another second height difference portion nearest to the second position is also placed, and the second position are arranged in a straight line, and a corner placed on a side on which the corner nearest to the second position among the corners of each of the second height difference portions is also placed, and the corner of another second height difference portion nearest to the second position, and the second position are arranged in a straight line.

10. A solid-state image device comprising:
a color filter formed on a first substrate; and
a height difference portions formed into a ring-shaped solid on the first substrate so that the height difference portion surrounds the color filter, wherein the height difference portion is configured to electrically connect the first substrate and a second substrate.

* * * * *